United States Patent
Kim et al.

(10) Patent No.: US 11,450,715 B2
(45) Date of Patent: Sep. 20, 2022

(54) DISPLAY DEVICE AND MANUFACTURING METHOD THEREOF

(71) Applicant: Samsung Display Co., Ltd., Yongin-si (KR)

(72) Inventors: Soodong Kim, Hwaseong-si (KR); YongSeok Choi, Yongin-si (KR); Sujin Kim, Seoul (KR); Woo-Man Ji, Asan-si (KR); Hoyeon Ji, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 16/795,343

(22) Filed: Feb. 19, 2020

(65) Prior Publication Data

US 2020/0312916 A1    Oct. 1, 2020

(30) Foreign Application Priority Data

Mar. 25, 2019    (KR) .................. 10-2019-0033840

(51) Int. Cl.
*H01L 27/32*    (2006.01)
*H01L 51/50*    (2006.01)
(Continued)

(52) U.S. Cl.
CPC .......... *H01L 27/322* (2013.01); *H01L 51/502* (2013.01); *H01L 51/5237* (2013.01); *H01L 51/56* (2013.01); *H01L 2251/301* (2013.01)

(58) Field of Classification Search
CPC . H01L 27/3244; H01L 27/322; H01L 27/326; H01L 27/3262; H01L 27/3246; H01L 27/3248

See application file for complete search history.

(56) References Cited

U.S. PATENT DOCUMENTS

| | | |
|---|---|---|
| 2013/0264937 A1 | 10/2013 | Sakuta et al. |
| 2014/0312339 A1* | 10/2014 | Fujita .................... H01L 27/322 |
| | | 257/40 |

(Continued)

FOREIGN PATENT DOCUMENTS

| | | |
|---|---|---|
| KR | 10-2017-0039064 | 4/2017 |
| KR | 10-2017-0134796 | 12/2017 |

(Continued)

OTHER PUBLICATIONS

Extended European Search Report dated Jun. 17, 2020, in European Patent Application No. 20164672.6.

*Primary Examiner* — Julio J Maldonado
*Assistant Examiner* — Stanetta D Isaac
(74) *Attorney, Agent, or Firm* — H.C. Park & Associates, PLC

(57) ABSTRACT

A display device includes a base substrate, a plurality of display elements, a first light control layer, and a second light control layer. The base substrate includes a pixel region and a peripheral region adjacent to the pixel region. The display elements are disposed on the base substrate, overlap the pixel region in a plan view, and are configured to generate a first light. The first light control layer is disposed on the display elements, and includes a transmission part configured to transmit the first light, a first light conversion part configured to convert the first light into a second light, and a second light conversion part configured to convert the first light into a third light. The second light control layer overlaps at least a portion of the first light conversion part in the plan view and is configured to convert the first light into the second light.

18 Claims, 16 Drawing Sheets

(51) Int. Cl.
  *H01L 51/52* (2006.01)
  *H01L 51/56* (2006.01)

(56) References Cited

U.S. PATENT DOCUMENTS

| | | |
|---|---|---|
| 2015/0048348 A1 | 2/2015 | Huang et al. |
| 2017/0090247 A1 | 3/2017 | Lee et al. |
| 2017/0343855 A1 | 11/2017 | Han et al. |
| 2018/0108303 A1 | 4/2018 | Park et al. |
| 2018/0157083 A1 | 6/2018 | Yeo et al. |

FOREIGN PATENT DOCUMENTS

| | | |
|---|---|---|
| KR | 10-2018-0042508 | 4/2018 |
| KR | 10-2018-0064629 | 6/2018 |
| KR | 10-2020-0063964 | 6/2020 |

\* cited by examiner

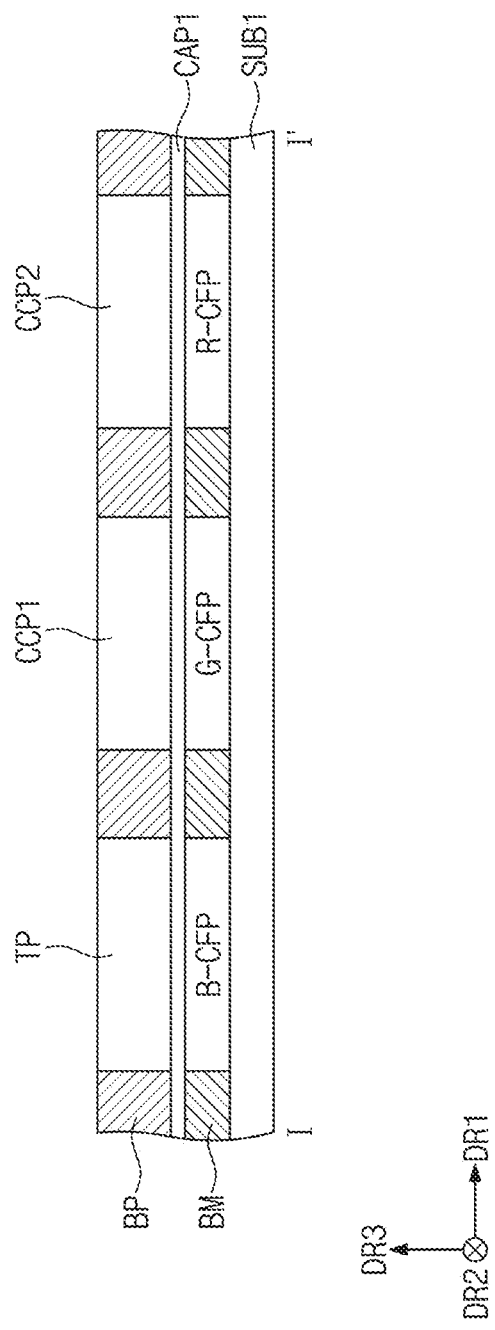

DISPLAY DEVICE AND MANUFACTURING METHOD THEREOF

CROSS-REFERENCE TO RELATED APPLICATION

This application claims priority to and the benefit of Korean Patent Application No. 10-2019-0033840, filed Mar. 25, 2019, which is hereby incorporated by reference for all purposes as if fully set forth herein.

BACKGROUND

Field

Exemplary embodiments generally relate to a display device and a method of manufacturing the same, and, more particularly, to a display device with improved light efficiency and a method of manufacturing the same.

Discussion

A display device may include a transmissive display panel that selectively transmits source light generated from a light source and a light emitting display panel that generates source light from the display panel itself. A display panel may include different types of color control layers depending on pixels to generate a color image. These color control layers may transmit only a portion, having a wavelength range, of source light, or may convert the color of the source light. Some color control layers may not change the color of source light, but may change the characteristics of the light.

The above information disclosed in this section is only for understanding the background of the inventive concepts, and, therefore, may contain information that does not form prior art.

SUMMARY

Some exemplary embodiments are capable of providing a display device having improved light efficiency by increasing the conversion efficiency of some light.

Some exemplary embodiments are capable of providing a method of manufacturing a display device, the method being capable of increasing the light efficiency of the display device by adding a simple process.

Additional aspects will be set forth in the detailed description which follows, and, in part, will be apparent from the disclosure, or may be learned by practice of the inventive concepts.

According to some exemplary embodiments, a display device includes a base substrate, a plurality of display elements, a first light control layer, and a second light control layer. The base substrate includes a pixel region and a peripheral region adjacent to the pixel region. The plurality of display elements are disposed on the base substrate, overlap the pixel region in a plan view, and are configured to generate a first light. The first light control layer is disposed on the plurality of display elements, and includes a transmission part configured to transmit the first light, a first light conversion part configured to convert the first light into a second light, and a second light conversion part configured to convert the first light into a third light. The second light control layer overlaps at least a portion of the first light conversion part in the plan view and is configured to convert the first light into the second light.

According to some exemplary embodiments, a display device includes a base substrate, a display element, a first light control layer, and a second light control layer. The base substrate includes a pixel region and a peripheral region adjacent to the pixel region. The display element is disposed on the base substrate and overlaps the pixel region in a plan view. The display element is configured to generate a first light. The first light control layer is disposed on the display element and overlaps the pixel region in the plan view. The first light control layer is configured to convert the first light into a second light. The second light control layer includes a portion overlapping the first light control layer in the plan view The second light control layer is configured to convert the first light into the second light.

According to some exemplary embodiments, a method of manufacturing a display device includes preparing an upper display substrate, which includes first, second, and third pixel regions and a peripheral region adjacent to the first, second, and third pixel regions; preparing a lower display substrate, which includes a plurality of display elements configured to generate a first light; and coupling the upper display substrate and the lower display substrate to one another. Preparing the upper display substrate includes preparing a base substrate, providing a first light control layer on a surface of the base substrate, and providing a second light control layer on the first light control layer. The first light control layer includes a transmission part corresponding to the first pixel region and configured to transmit the first light; a first light conversion part corresponding to the second pixel region and configured to convert the first light into a second light; and a second light conversion part corresponding to the third pixel region and configured to convert the first light into a third light. The second light control layer is configured to convert the first light into the second light.

The foregoing general description and the following detailed description are exemplary and explanatory and are intended to provide further explanation of the claimed subject matter.

BRIEF DESCRIPTION OF THE FIGURES

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings:

FIGS. 12A, 12B, 12C, and 12D are cross-sectional views of a display device at various stages of manufacture according to some exemplary embodiments.

DETAILED DESCRIPTION OF SOME EXEMPLARY EMBODIMENTS

Figure 1:
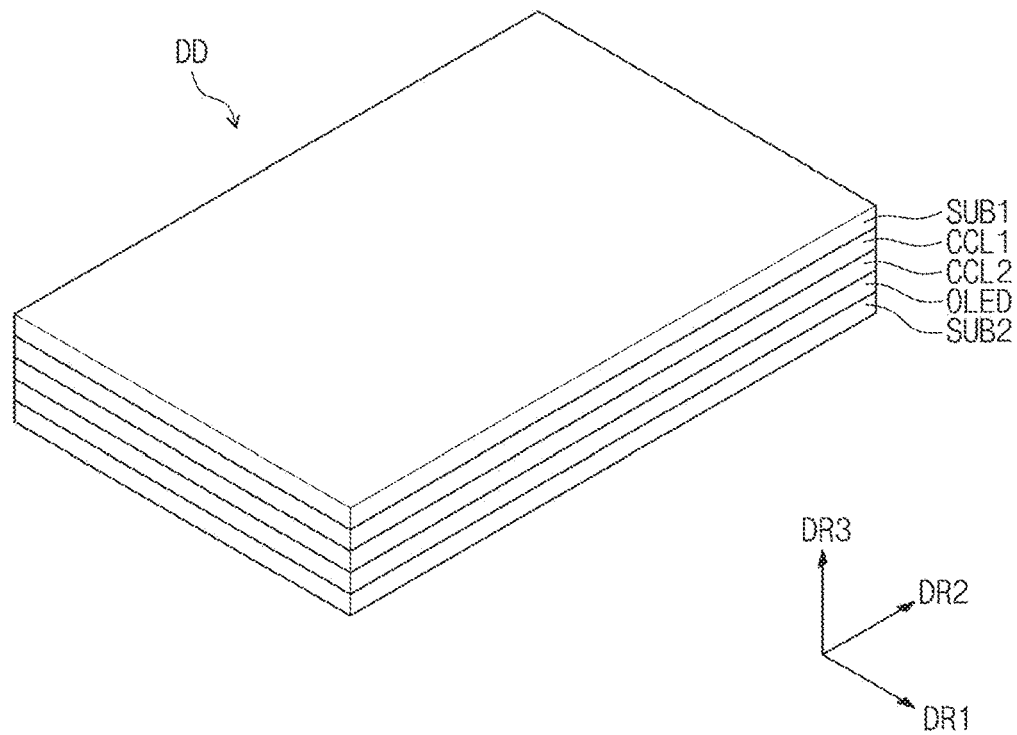
FIG. 1 is a perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Also, for the purposes of this disclosure, the phrase "directly contacts" means that there are no elements added between directly contacting elements. For example, a first element that "directly contacts" a second element may mean that the first element is disposed on the second element without additional elements, such as an adhesive member, between the first and second elements.

Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
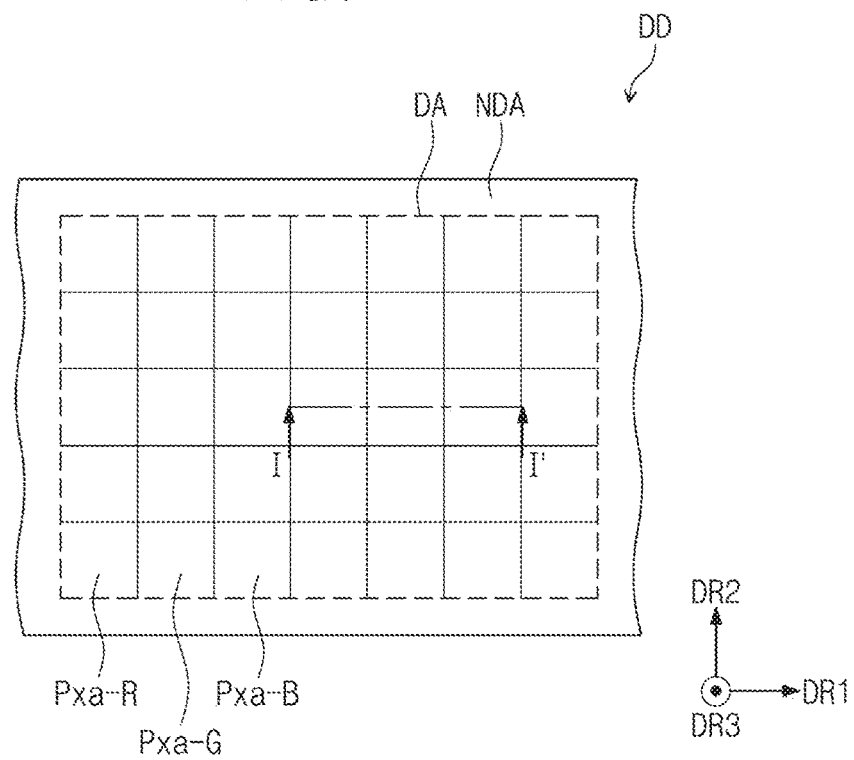
FIG. 2 is a plan view of a display device according to some exemplary embodiments.
Figure 3:
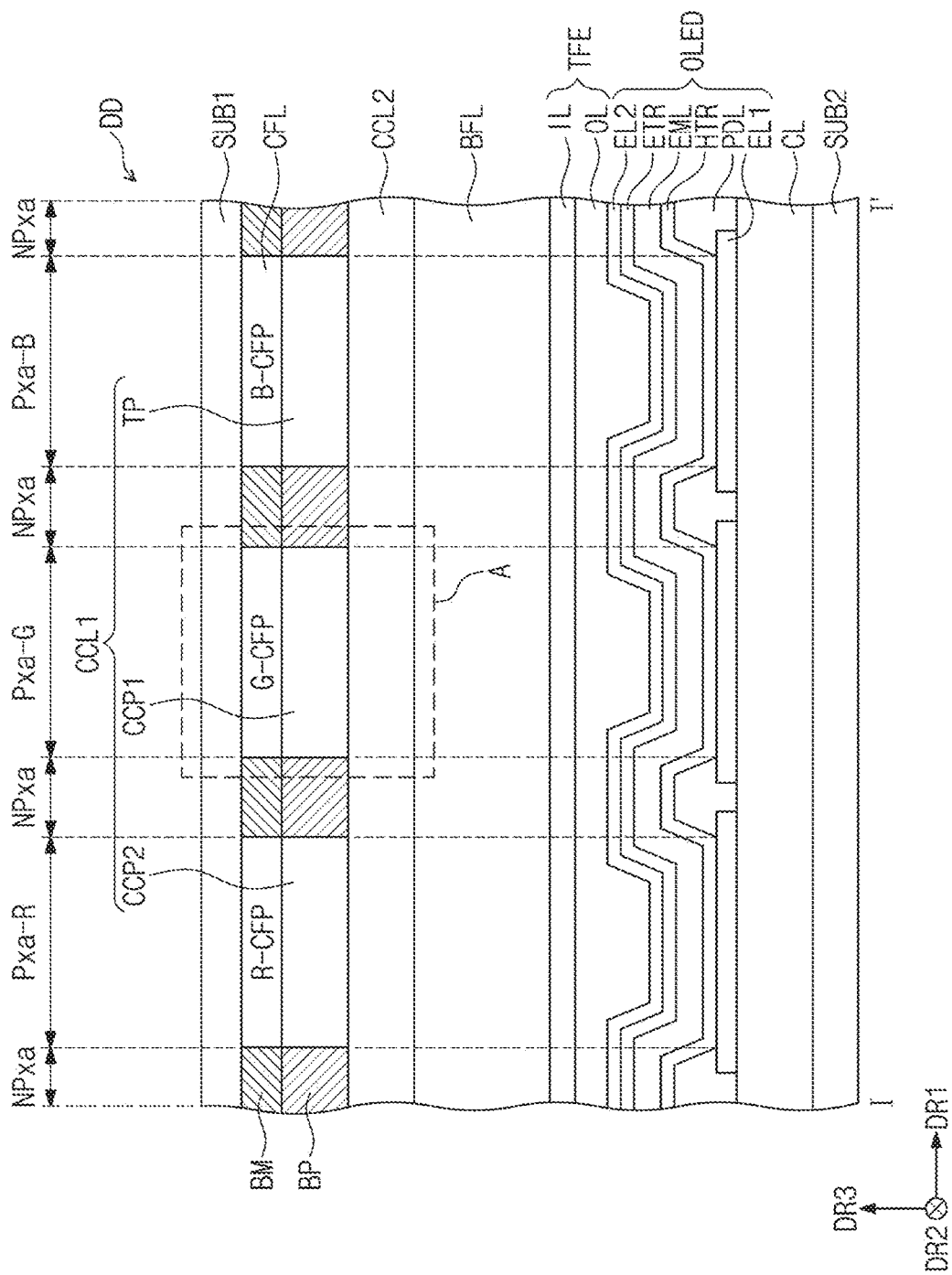
FIG. 3 is a cross-sectional view taken along sectional line I-I' of FIG. 2 according to some exemplary embodiments.

FIG. 1 is a perspective view of a display device according to some exemplary embodiments. FIG. 2 is a plan view of a display device according to some exemplary embodiments. FIG. 3 is a cross-sectional view taken along sectional line I-I' of FIG. 2 according to some exemplary embodiments.

Referring to FIG. 1, a display device DD includes a display element OLED, a first light control layer CCL1 disposed on the display element OLED, and a second light control layer CCL2.

The display element OLED according to some exemplary embodiments may be an organic light emitting diode OLED as a self-light emitting element, and the organic light emitting diode OLED may generate a first light. For example, the first light provided by the organic light emitting diode OLED may be blue light, and the blue light may be light corresponding to light of a wavelength region of 410 nm to 480 nm.

The display device DD may further include a first substrate SUB1 and a second substrate SUB2 that are disposed to face each other, and the organic light emitting diode OLED may be disposed on the second substrate SUB2.

Referring to FIG. 2, the display device DD of some exemplary embodiments may include a display region DA, which displays an image, and a non-display region NDA, which does not display an image. The non-display region NDA may be disposed outside, e.g., on the outer periphery, of the display region DA.

The display device DD may have a quadrangular shape having a plane defined by an axis of a first direction DR1 and an axis of a second direction DR2; however, exemplary embodiments are not limited thereto. The shape of the display region DA and the shape of the non-display region NDA may be correlatively designed.

Although in FIG. 2, the display device DD is illustrated as having a planar display surface, exemplary embodiments are not limited thereto. In some exemplary embodiments, the display device DD may include a curved display surface or a three-dimensional display surface. The three-dimensional display surface may include a plurality of display regions indicating different directions, and may include, for example, a polygonal column type display surface.

The display region DA may include a plurality of pixel regions Pxa-B, Pxa-G, and Pxa-R. The pixel regions Pxa-B, Pxa-G, and Pxa-R may be defined by, for example, a plurality of gate lines and a plurality of data lines. The pixel regions Pxa-B, Pxa-G, and Pxa-R may be disposed in a matrix form. On each of the pixel regions Pxa-B, Pxa-G, and Pxa-R, a pixel to be described later may be disposed.

The display device DD may include a first pixel region, a second pixel region, and a third pixel region that are disposed adjacent to each other in a plan view and emit light of different wavelengths. In some exemplary embodiments, the first pixel region may be a blue pixel region Pxa-B, the second pixel region may be a green pixel region Pxa-G, and the third pixel region may be a red pixel region Pxa-R. For instance, in some exemplary embodiments, the display device DD may include the blue pixel region Pxa-B, the green pixel region Pxa-G, and the red pixel region Pxa-R. The blue pixel region Pxa-B may be a blue light emitting region for emitting blue light, and the green pixel region Pxa-G and the red pixel region Pxa-R may respectively represent a green light emitting region and a red light emitting region.

In some exemplary embodiments, the display device DD may be a rigid display device, but exemplary embodiments are not limited thereto. The display device DD according to some exemplary embodiments may be a flexible display device or a hybrid rigid and flexible display device.

Referring to FIG. 3, the display device DD of some exemplary embodiments may include the first substrate SUB1 and the second substrate SUB2 facing each other. The first substrate SUB1 and the second substrate SUB2 may respectively be at least one of a polymer substrate, a plastic substrate, a glass substrate, and a quartz substrate. Each of the first substrate SUB1 and the second substrate SUB2 may be a transparent insulation substrate. Each of the first substrate SUB1 and the second substrate SUB2 may be rigid. Each of the first substrate SUB1 and the second substrate SUB2 may be flexible. In FIG. 3, the display device DD is illustrated as including the first substrate SUB1 and the second substrate SUB2; however, exemplary embodiments are not limited thereto. For instance, at least any one of the first substrate SUB1 and the second substrate SUB2 may be omitted.

The display device DD may include a circuit layer CL disposed on the second substrate SUB2. The circuit layer CL will be described in more detail with reference to FIG. 11 below.

In some exemplary embodiments, the display device DD may include a first organic light emitting diode OLED overlapping the first pixel region Pxa-B, a second organic light emitting diode OLED overlapping the second pixel region Pxa-G, and a third organic light emitting diode OLED overlapping the third pixel region Pxa-R.

Each of the first to third organic light emitting diodes OLED may include a first electrode EL1, a hole transport region HTR, a light emitting layer EML, an electron transport region ETR, and a second electrode EL2 that are sequentially laminated.

The light emitting layer EML of the first to third organic light emitting diodes OLED has an integral shape, and may be commonly disposed in the first to third pixel regions Pxa-B, Pxa-G, and Pxa-R, as well as in a peripheral region NPxa. The light emitting layer EML may generate the first light. For example, the light emitting layer EML may generate blue light.

An encapsulation member TFE is disposed on the organic light emitting diode OLED and encapsulating the organic light emitting diode OLED. The encapsulation member TFE may include an inorganic film IL disposed on an outermost periphery. The encapsulation member TFE may further include an organic film OL, or may have a structure in which the inorganic film IL and the organic film OL are alternately repeated. The encapsulation member TFE may serve to protect the organic light emitting diode OLED from moisture and/or oxygen and protect the organic light emitting diode OLED from foreign materials, such as dust particles.

In some exemplary embodiments, the inorganic film IL may include any material capable of protecting the organic light emitting diode OLED without any particular limitation, such as, for example, may include at least one of silicon nitride (SiNx), silicon oxynitride (SiOyNx), silicon oxide (SiOy), titanium oxide (TiOy), aluminum oxide (AlOy), and the like.

The organic film OL may include an acrylate-based organic material, but is not particularly limited thereto. The inorganic film IL may be formed by a deposition method and/or the like, and the organic film OL may be formed by a deposition method, a coating method, and/or the like.

The display device DD according to some exemplary embodiments includes the first light control layer CCL1 and the second light control layer CCL2.

The first light control layer CCL1 includes a transmission part TP that transmits the first light, a first light conversion part CCP1 that converts the first light into a second light, and a second light conversion part CCP2 that converts the first light into a third light. For example, the second light may be green light, and the green light may be light corresponding to light of a wavelength region of 500 nm to 570 nm. The third light may be red light, and the red light may be light corresponding to light of a wavelength region of 625 nm to 675 nm.

The first light conversion part CCP1 and the second light conversion part CCP2 may include a light emitting body. The light emitting body may be a particle that converts the wavelength of light. In some exemplary embodiments, the light emitting body included in the first light conversion part CCP1 and the second light conversion part CCP2 may be a quantum dot, but exemplary embodiments are not limited thereto.

The quantum dot is a material having a crystal structure of a few nanometers in size, and is composed of hundreds to thousands of atoms. Due to the small size thereof, a quantum dot exhibits a quantum confinement effect in which an energy band gap is increased. When light of a wavelength having higher energy than a band gap is incident on a quantum dot, the quantum dot is excited by absorbing the light and falls to a ground state by emitting light of a another (e.g., specific) wavelength. The wavelength of the emitted light has a value corresponding to the band gap. When the size and composition of a quantum dot is adjusted, light emitting properties caused by the quantum confinement effect may be adjusted.

The quantum dot may be selected from at least one of a Group II-VI compound, a Group III-V compound, a Group IV-VI compound, a Group IV element, a Group IV compound, and/or any combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and/or a combination including at least one of the binary element compounds, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or a combination including at least one of the ternary element compounds, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and/or a combination including at least one of the quaternary element compounds.

The Group III-V compound may be selected from the group consisting of a binary compound selected from the group consisting of GaN, GaP, GaAs, GaSb, AlN, AlP, AlAs, AlSb, InN, InP, InAs, InSb, and/or a combination including at least one of the binary element compounds, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and/or a combination including at least one of the ternary element compounds, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or a combination including at least one of the quaternary element compounds.

The Group IV-VI compound may be selected from the group consisting of a binary compound selected from the group consisting of SnS, SnSe, SnTe, PbS, PbSe, PbTe, and/or a combination including at least one of the binary element compounds, a ternary compound selected from the group consisting of SnSeS, SnSeTe, SnالسTe, PbSeS, PbSeTe, PbSTe, SnPbS, SnPbSe, SnPbTe, and/or a combination including at least one of the ternary element compounds, and a quaternary compound selected from the group consisting of SnPbSSe, SnPbSeTe, SnPbSTe, and/or a combination including at least one of the quaternary element compounds. The Group IV element may be selected from the group consisting of Si, Ge, and a mixture thereof. The Group IV compound may be a binary compound selected from the group consisting of SiC, SiGe, and a mixture thereof.

In some exemplary embodiments, a binary compound, a ternary compound, or a quaternary compound may be present in a particle with a uniform concentration distribution, or may be present in the same particle with a partially different concentration.

The quantum dot may have a core-shell structure in which a core and a shell surrounding the core are included. In addition, a quantum dot may have a core-shell structure in which one quantum dot surrounds another quantum dot. An interface between a core and a shell may have a concentration gradient in which the concentration of an element present in the shell becomes lower toward the center.

The quantum dot may be a particle having a size of nanometers. The quantum dot may have a full width at half maximum (FWHM) of a light emission wavelength spectrum of about 45 nm or less, such as about 40 nm or less, for instance, about 30 nm or less, and color purity or color reproducibility may be improved in the aforementioned range. In addition, light emitted through such a quantum dot is emitted in all directions so that a wide viewing angle may be improved.

In addition, the form of a quantum dot is not particularly limited. For instance, the form of the quantum dot may be a form commonly used in the art. For example, a quantum dot in the form of spherical, pyramidal, multi-arm, or cubic nanoparticles, nanotubes, nanowires, nanofibers, nanoparticles, and/or the like may be used.

The quantum dot may change the color of emitted light depending on the particle size thereof. For example, the particle size of a quantum dot included in the first light conversion part CCP1 may be smaller than the particle size of a quantum dot included in the second light conversion part CCP2. In this manner, the quantum dot included in the first light conversion part CCP1 may emit light of a shorter wavelength that the quantum dot included in the second light conversion part CCP2.

In some exemplary embodiments, the first light control layer CCL1 may include a base resin and a light emitting body. The first light control layer CCL1 may further include a scattering particle. The light emitting body and the scattering particle may be included in only a portion of the first light control layer CCL1. In some exemplary embodiments, the transmission part TP may not include the light emitting body, but may include the scattering particle. The first light conversion part CCP1 and the second light conversion part CCP2 may include both light emitting body and the scattering particle.

The first light control layer CCL1 may include the transmission part TP and a plurality of light conversion parts CCP1 and CCP2. In some exemplary embodiments, each of the transmission part TP, the first light conversion part CCP1, and the second light conversion part CCP2 may be spaced apart from each other in a plan view. Referring to FIG. 3, each of the transmission part TP, the first light conversion part CCP1, and the second light conversion part CCP2 may be spaced apart from each other in a plan view defined by the axis of the first direction DR1 and an axis of a third direction DR3.

The transmission part TP may be disposed corresponding to the first pixel region Pxa-B, the first light conversion part CCP1 may be disposed corresponding to the second pixel region Pxa-G, and the second light conversion part CCP2 may be disposed corresponding to the third pixel region Pxa-R.

As seen in FIG. 3, the transmission part TP, the first light conversion part CCP1, and the second light conversion part CCP2 are illustrated as having the same area or the same thickness. However, exemplary embodiments are not limited thereto. The transmission part TP, the first light conversion part CCP1, and the second light conversion part CCP2 may have different areas and/or different thicknesses. For example, the second light conversion part CCP2 may have a larger area than the transmission part TP and the first light conversion part CCP1. In some exemplary embodiments, the transmission part TP may have a smaller area than the first light conversion part CCP1 and the second light conversion part CCP2.

A light blocking pattern BP may be disposed between the transmission part TP and the first light conversion part CCP1, which are spaced apart from one another, and/or between the first light conversion part CCP1 and the second light conversion part CCP2. As seen in FIG. 3, the light blocking pattern BP is illustrated as being disposed between each of the transmission part TP, the first light conversion part CCP1, and the second light conversion part CCP2; however, exemplary embodiments are not limited thereto. For instance, in the display device DD according to some exemplary embodiments, the light blocking pattern BP may be omitted.

The second light control layer CCL2 overlaps at least a portion of the first light conversion part CCP1 in a plan view. In some exemplary embodiments, in a plan view, the second light control layer CCL2 overlaps the first light conversion part CCP1, and may also overlap the transmission part TP and the second light conversion part CCP2. The second light control layer CCL2 may entirely overlap the first light control layer CCL1 in a plan view.

In some exemplary embodiments, the second light control layer CCL2 may contact the first light control layer CCL1. The second light control layer CCL2 is disposed on a lower portion of the first light control layer CCL1, and may contact a lower surface of the first light control layer CCL1. The second light control layer CCL2 may contact a lower surface of the first light conversion part CCP1 of the first light control layer CCL1.

The second light control layer CCL2 may have substantially the same refractive index as the first light control layer CCL1. The second light control layer CCL2 may have substantially the same refractive index as the first light conversion part CCP1. In some exemplary embodiments, the second light control layer CCL2 includes the same base resin as the first light conversion part CCP1, and may have substantially the same refractive index as the first light conversion part CCP1.

The second light control layer CCL2 may convert the first light into the second light. For instance, the first light may be blue light, and the first light conversion part CCP1 of the first light control layer CCL1 may convert blue light into green light, and the second light control layer CCL2 may also convert blue light into green light. However, exemplary embodiments are not limited thereto. The second light conversion layer CCL2 may convert blue light into red light in the same manner as the second light conversion part CCP2.

The second light control layer CCL2 may include a light emitting body. The light emitting body included in the second light control layer CCL2 may be a quantum dot. The light emitting body included in the second light control layer CCL2 may convert the first light into the second light. For example, the light emitting body included in the second light control layer CCL2 may be the same light emitting body included in the first light conversion part CCP1, and may convert blue light into green light. However, exemplary embodiments are not limited thereto. The light emitting body included in the second light control layer CCL2 may be the same light emitting body included in the second light conversion part CCP2, and may convert blue light into red light. Alternatively, the second light control layer CCL2 may include both the light emitting body converting blue light into red light and the light emitting body converting blue light into green light. In some exemplary embodiments, the second light control layer CCL2 may not include a light emitting body, but may include the scattering particle.

In some exemplary embodiments, the display device DD may include a color filter layer CFL. The color filter layer CFL may be disposed on the first light control layer CCL1, and may include first to third color filter parts B-CFP, G-CFP, and R-CFP, and a light blocking member BM.

In some exemplary embodiments, the first to third color filter parts B-CFP, G-CFP, and R-CFP may be spaced apart from each other in a plan view. Referring to FIG. 3, the first to third color filter parts B-CFP, G-CFP, and R-CFP may be spaced apart from each other along the first direction DR1.

The first color filter part B-CFP may be disposed corresponding to the transmission part TP and transmit the first light. The second color filter part G-CFP may be disposed corresponding to the first light conversion part CCP1 and block the first light and transmit the second light. The third color filter part R-CFP may be disposed corresponding to the second light conversion part CCP2 and block the first light and transmit the third light. By including the color filter layer CFL in the display device DD, external light reflection may be effectively reduced, and color mixing may be prevented or at least reduced.

The light blocking member BM is provided corresponding to the peripheral region NPxa. The light blocking member BM may be formed by including an organic light blocking material or an inorganic light blocking material both including a black pigment or a black dye. The light blocking member BM may prevent (or at least reduce) a light leakage phenomenon and distinguish the boundaries between the adjacent color filter parts. At least a portion of the light blocking member BM may be disposed overlapping a neighboring color filter part. For instance, in a plan view defined by the axis of the first direction DR1 and the axis of the third direction DR3, the light blocking member BM may be disposed such that at least a portion of the light blocking member BM may overlap neighboring color filter parts in a thickness direction, e.g., the third direction DR3. As seen in FIG. 3, the light blocking member BM is exemplarily illustrated as entirely overlapping corresponding color filter parts in the thickness direction so that the thickness of the light blocking member BM is the same as the thickness of the entire color filter layer CFL. However, exemplary embodiments are not limited thereto. The thickness of the light blocking member BM may be less than the thickness of the entire color filter layer CFL. In some exemplary embodiments, the light blocking member BM is disclosed as being included in the color filter layer CFL. However, exemplary embodiments are not limited thereto. The light blocking member BM may be omitted.

A filling layer BFL may be disposed between the encapsulation member TFE and the second light control layer CCL2. The filling layer BFL may be disposed between the encapsulation member TFE and the second light control layer CCL2 to prevent the second light control layer CCL from being in contact with the encapsulation member TFE and improve the light extraction efficiency of the display device DD.

In some exemplary embodiments, the filling layer BFL may fill between the encapsulation member TFE and the second light control layer CCL2. Filling between the encapsulation member TFE and the second light control layer CCL2 may mean that a space between the encapsulation member TFE and the second light control layer CCL2 is filled with the filling layer BFL such that there is no internal space between the encapsulation member TFE and the second light control layer CCL2, and that the filling layer BFL contacts the encapsulation member TFE and the second light control layer CCL2.

The filling layer BFL may prevent a light emitting body and/or a scattering particle and the like included in the second light control layer CCL2 from being oxidized by internal air, and, thus, the light extraction efficiency of the display device DD may be maintained without being greatly changed.

In some exemplary embodiments, the filling layer BFL may be disposed directly on the inorganic film IL disposed on the outermost periphery of the encapsulation member TFE. The filling layer BFL may include an inorganic binder, an organic binder, or a liquid crystal compound, but is not particularly limited thereto.

As seen in FIG. 3, the filling layer BFL is exemplarily illustrated as being disposed between the encapsulation member TFE and the second light control layer CCL2, but exemplary embodiments are not limited thereto. In the display device DD according to some exemplary embodiments, the filling layer BFL may be omitted. In this case, the second light control layer CCL2 may be disposed directly on an upper surface of the encapsulation member TFE, e.g., directly on the inorganic film IL of the encapsulation member TFE.

According to various exemplary embodiments, a display device may include, with respect to a first light conversion part that converts a first light into a second light, a second light control layer overlapping the first light conversion part in a plan view. In addition, the second light control layer may convert the first light into the second light in the same manner as the first light conversion part. Accordingly, the display device according to some exemplary embodiments may increase the light conversion efficiency of light having a specific wavelength or wavelength range. As such, overall light efficiency of the display device may be increased.

Figure 4:
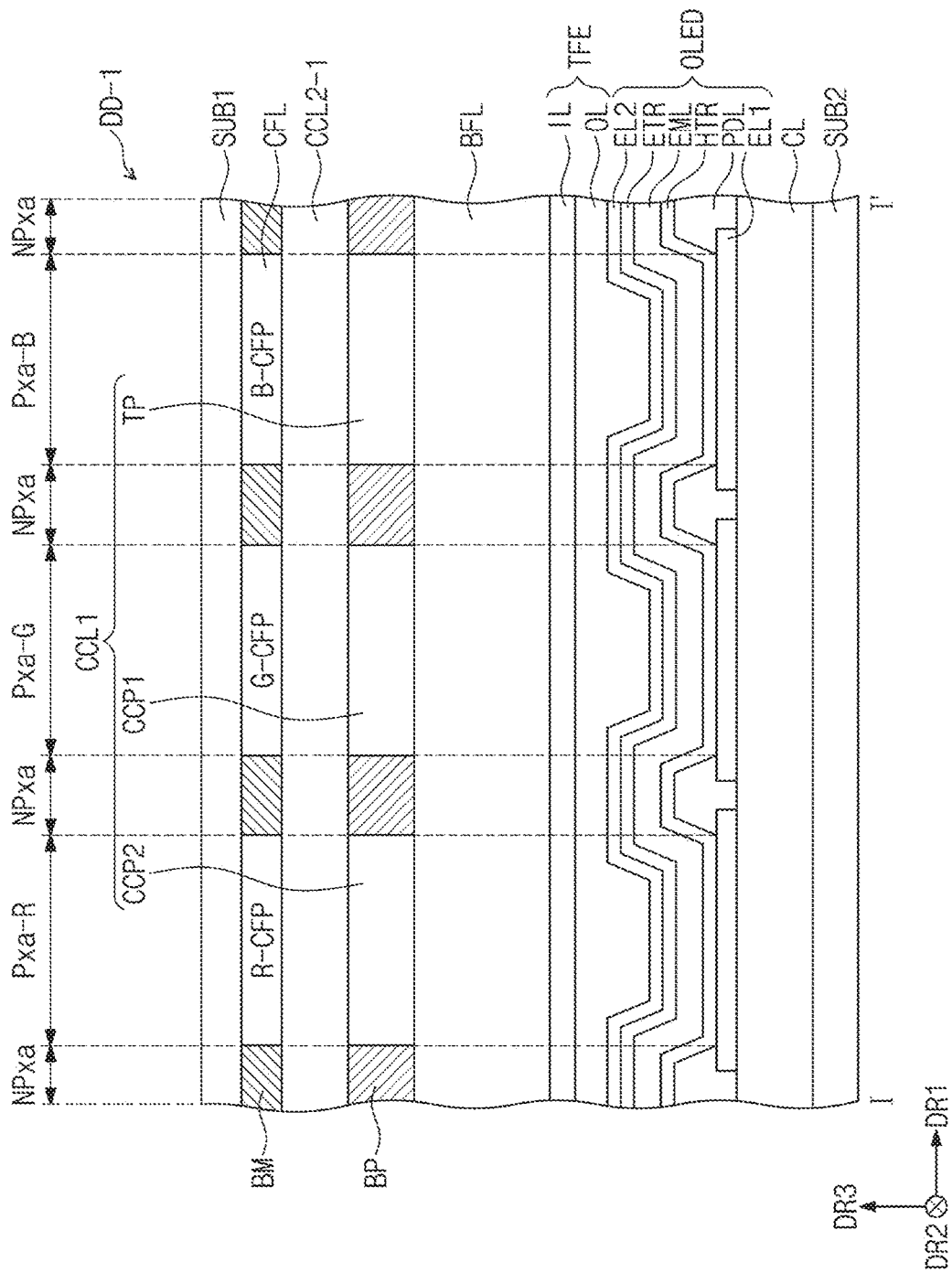
FIG. 4 is a cross-sectional view of a display device taken along sectional line I-I' of FIG. 2 according to some exemplary embodiments.
Figure 5:
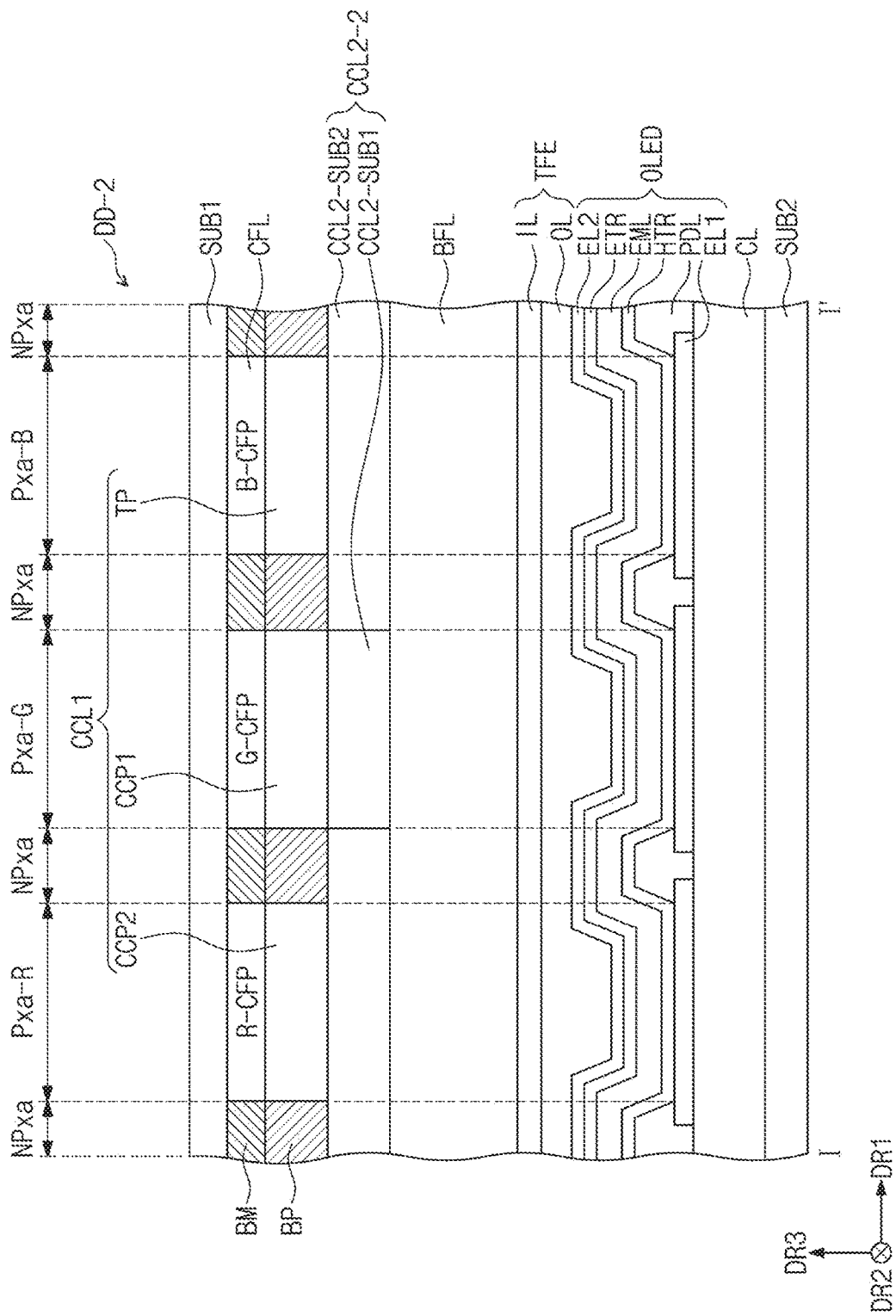
FIG. 5 is a cross-sectional view of a display device taken along sectional line I-I' of FIG. 2 according to some exemplary embodiments.
Figure 6:
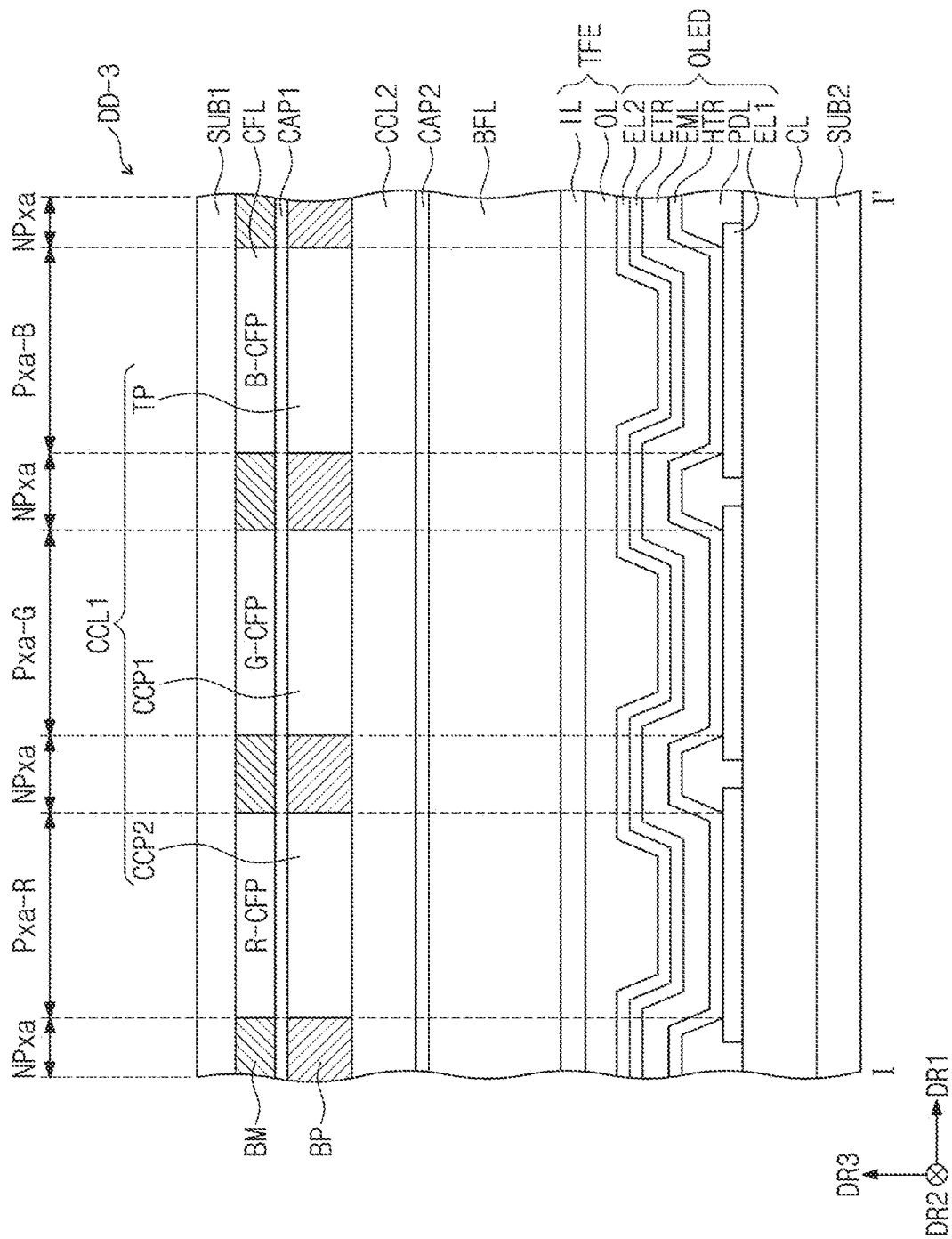
FIG. 6 is a cross-sectional view of a display device taken along sectional line I-I' of FIG. 2 according to some exemplary embodiments.

FIGS. 4 to 6 are cross-sectional views of a display device according to various exemplary embodiments. In display devices DD1, DD-2, and DD-3 shown in FIGS. 4 to 6 according to various exemplary embodiments, cross sections corresponding to sectional line I-I' of FIG. 2 are illustrated. Hereinafter, in the description of FIGS. 4 to 6, the same reference numerals are given to the elements described with reference to FIG. 3 and the description of duplicative components are primarily omitted.

Referring to FIG. 4, in a display device DD-1 according to some exemplary embodiments, a second light control layer CCL2-1 may be disposed between a color filter layer CFL and a first light control layer CCL1. The second light control layer CCL2-1 may be disposed such that at least a portion of the second light control layer CCL2-1 overlaps a first light conversion part CCP1 and a second color filter part G-CFP. Between the color filter layer CFL and the first light control layer CCL1, the second light control layer CCL2-1 may be disposed such that at least a portion thereof may contact an upper surface of the first light conversion part CCP1.

Referring to FIG. 5, in a display device DD-2 according to some exemplary embodiments, a second light control layer CCL2-2 may include a first sub-light conversion part CCL2-SUB1 and a second sub-light conversion part CCL2-SUB2.

The first sub-light conversion part CCL2-SUB1 may entirely overlap a first light conversion part CCP1 in a plan view. The first sub-light conversion part CCL2-SUB1 and the first light conversion part CCP1 may be patterned so as to entirely overlap a second pixel region Pxa-G and not to overlap a peripheral region NPxa, a first pixel region Pxa-B, and a third pixel region Pxa-R.

The first sub-light conversion part CCL2-SUB1 may contact the first light conversion part CCP1. The first sub-light conversion part CCL2-SUB1 may convert a first light into a second light in the same manner as the first light conversion part CCP1. The first sub-light conversion part CCL2-SUB1 may include the same light emitting body as a light emitting body included in the first light conversion part CCP1. For example, the first light conversion part CCP1 may include a quantum dot converting blue light into green light, and the first sub-light conversion part CCL2-SUB1 may also include a quantum dot converting blue light into green light.

The second sub-light conversion part CCL2-SUB2 may not overlap the first light conversion part CCP1 in a plan view. The second sub-light conversion part CCL2-SUB2 may overlap a transmission part TP and a second light conversion part CCP2 in a plan view, and may include a plurality of scattering particles. The second sub-light conversion part CCL2-SUB2 may not include the light emitting body included in the first light conversion part CCP1.

In a display device DD-2 according to some exemplary embodiments, a second light control layer CCL2-2 may be patterned and disposed so as to overlap only a first light conversion part CCP1 on a plane. Since the second light control layer CCL2-2, which converts a first light into a second light, is disposed so as to overlap only the first light conversion part CCP1 in a plan view and not to overlap a transmission part TP and a second light conversion part CCP2, light conversion efficiency into the second light may be increased and color mixing may be prevented or at least reduced.

Referring to FIG. 6, a display device DD-3 according to some exemplary embodiments may further include at least one of first and second capping layers CAP1 and CAP2.

In some exemplary embodiments, a capping layer may be disposed between a second light control layer CCL2 and a filling layer BFL and/or between a first light control layer CCL1 and a color filter layer CFL. In some exemplary embodiments, a first capping layer CAP1 may be disposed on an upper surface of the first light control layer CCL1, e.g., between the first light control layer CCL1 and the color filter layer CFL, and a second capping layer CAP2 may be disposed on a lower surface of a second light control layer CCL2, e.g., between the second light control layer CCL2 and the filling layer BFL. The capping layer may be composed of an inorganic material, and the kind of the inorganic material is not particularly limited. The capping layer may be disposed to surround the first light control layer CCL1 and the second light control layer CCL2, and protect the first light control layer CCL1 and the second light control layer CCL2.

FIGS. 7A to 7D are cross-sectional views of a portion corresponding to region A of FIG. 3 according to various exemplary embodiments. Hereinafter, with reference to FIGS. 7A to 7D, a first light conversion part and a second light control layer will be described in more detail. Hereinafter, in the description of FIGS. 7A to 7D, the same reference numerals are given to the elements described above and duplicative descriptions are primarily omitted.

Figure 7A:
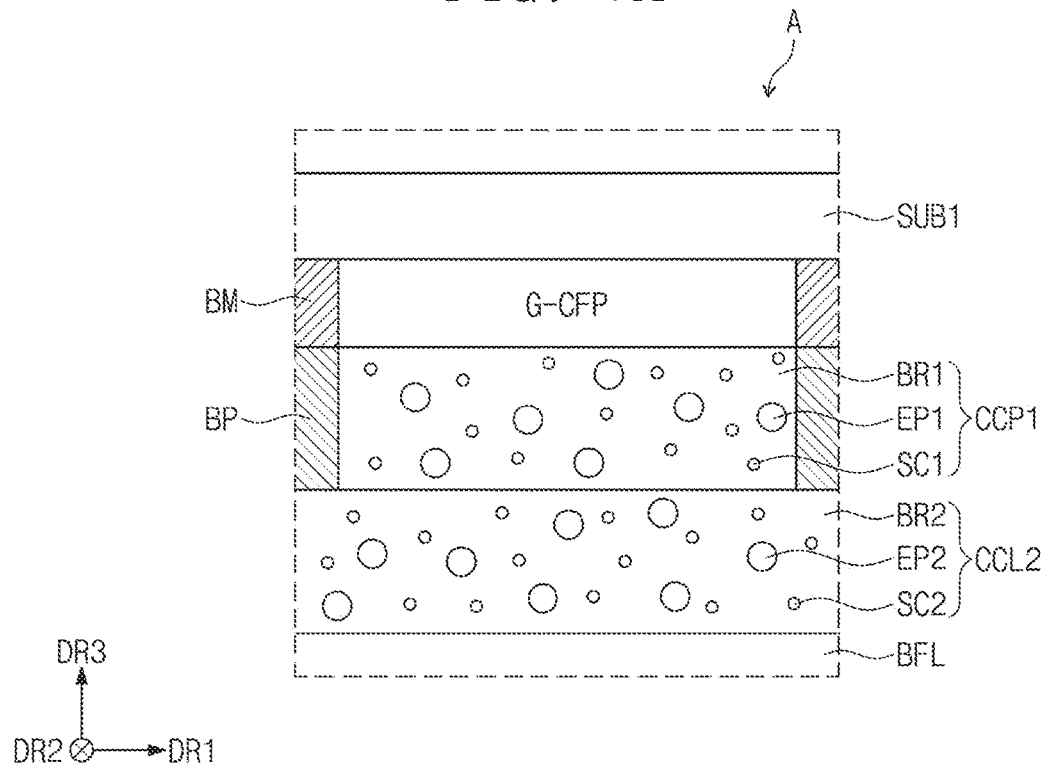
FIGS. 7A, 7B, 7C, and 7D are cross-sectional views corresponding to region A of FIG. 3 according to various exemplary embodiments.

Referring to FIG. 7A, the first light conversion part CCP1 may include a first light emitting body EP1, a first scattering particle SC1, and a first base resin BR1. The second light control layer CCL2 may include a second light emitting body EP2, a second scattering particle SC2, and a second base resin BR2.

The first base resin BR1 and the second base resin BR2 are media in which light emitting bodies are dispersed, and may be composed of various resin compositions, which may be generally referred to as binders. However, exemplary embodiments are not limited thereto. In the present specification, any medium may be referred to as a base resin regardless of the name, additional function(s), composition material(s), and the like as long as it may disperse and dispose light emitting bodies. A base resin may be a polymer resin. For example, a base resin may be at least one of an acrylic resin, a urethane-based resin, a silicone-based resin, an epoxy resin, and the like. A base resin may be a transparent resin.

The first base resin BR1 and the second base resin BR2 may have substantially the same refractive index. In some exemplary embodiments, the first base resin BR1 and the second base resin BR2 may be composed of the same material and may have substantially the same refractive index.

The first light emitting body EP1 and the second light emitting body EP2 may be particles that convert the wavelength of light. In some exemplary embodiments, the first light emitting body EP1 and the second light emitting body EP2 may be quantum dots.

The first light emitting body EP1 and the second light emitting body EP2 may be particles that convert a first light into a second light. In some exemplary embodiments, the first light emitting body EP1 and the second light emitting body EP2 may be quantum dots that convert blue light into green light. The first light emitting body EP1 and the second light emitting body EP2 may include the same material, and may be quantum dots of the same size.

The first light emitting body EP1 may be uniformly dispersed in the first light conversion part CCP1. The second light emitting body EP2 may be uniformly dispersed in the second light conversion layer CCL2. The second light emitting body EP2 may be uniformly dispersed in the second light conversion layer CCL2, thereby being dispersed in a region overlapping the second light conversion layer CCL2 and the transmission part TP (see FIG. 3).

The first scattering particle SC1 and the second scattering particle SC2 may be at least one of titanium dioxide ($TiO_2$) and silica-based nanoparticles, but exemplary embodiments are not limited thereto. The first scattering particle SC1 and the second scattering particle SC2 may scatter light. The first scattering particle SC1 and the second scattering particle SC2 may include the same material. The first scattering particle SC1 and the second scattering particle SC2 may be the same particles. In some exemplary embodiments, the first scattering particle SC1 and the second scattering particle SC2 may be omitted.

Figure 7B:
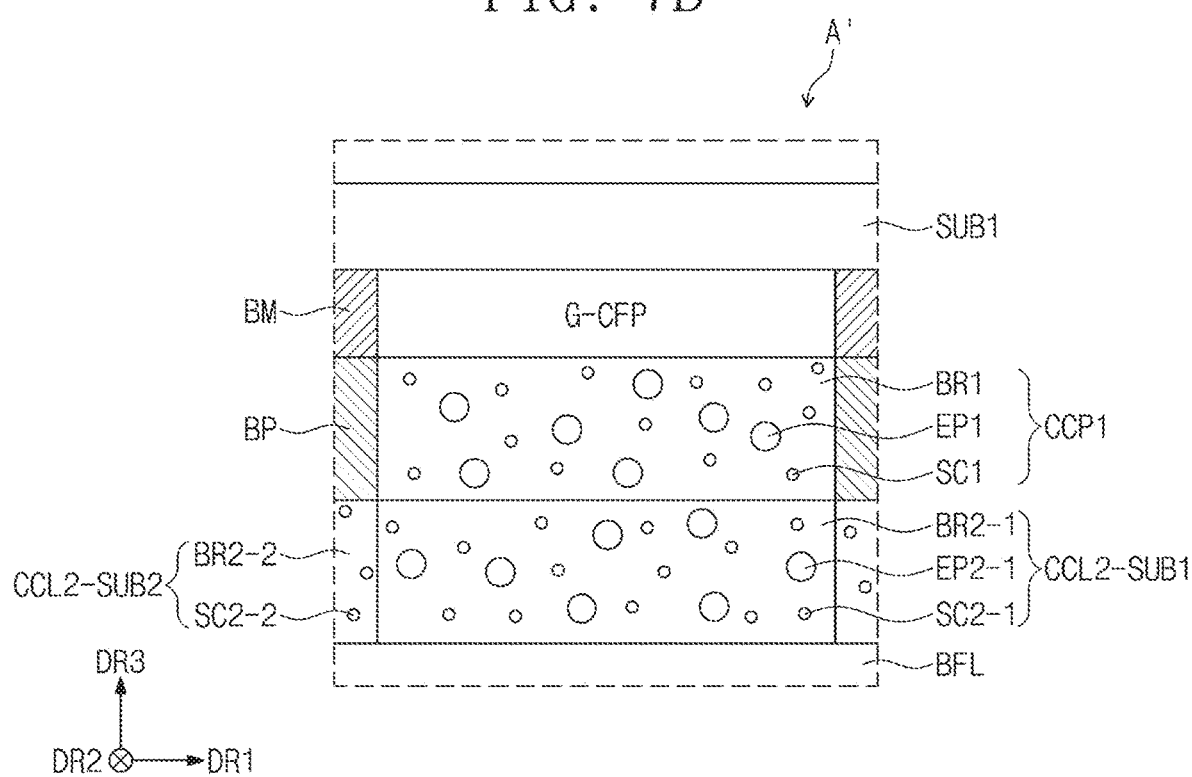

Referring to FIG. 7B, a second light control layer may include the first sub-light conversion part CCL2-SUB1 and the second sub-light conversion part CCL2-SUB2.

The first sub-light conversion part CCL2-SUB1 may be patterned so as to entirely overlap the first light conversion part CCP1 in a plan view. The first sub-light conversion part CCL2-SUB1 may contact the first light conversion part CCP1.

The first sub-light conversion part CCL2-SUB1 may include a second base resin BR2-1, a second light emitting body EP2-1, and a second scattering particle SC2-1.

The second base resin BR2-1 may have substantially the same refractive index as the first base resin BR1. In some exemplary embodiments, the first base resin BR1 and the second base resin BR2-1 may be composed of the same material and may have substantially the same refractive index.

The second light emitting body EP2-1 included in the first sub-light conversion part CCL2-SUB1 may be a particle that converts the first light into the second light in the same manner as the first light emitting body EP1 included in the first light conversion part CCP1. In some exemplary embodiments, the first light emitting body EP1 and the second light emitting body EP2-1 may be quantum dots that convert blue light into green light. The first light emitting body EP1 and the second light emitting body EP2-1 may include the same material, and may be quantum dots of the same size.

The second sub-light conversion part CCL2-SUB2 may include a second base resin BR2-2 and a second scattering particle SC2-2. The second sub-light conversion part CCL2-SUB2 may not include a light emitting body. For instance, in a second light control layer according to some exemplary embodiments, a light emitting body may be included only in the first sub-light conversion part CCL2-SUB1 overlapping the first light conversion part CCP1, but not in the second sub-light conversion part CCL2-SUB2, which does not overlap the first light conversion part CCP1.

Figure 7C:
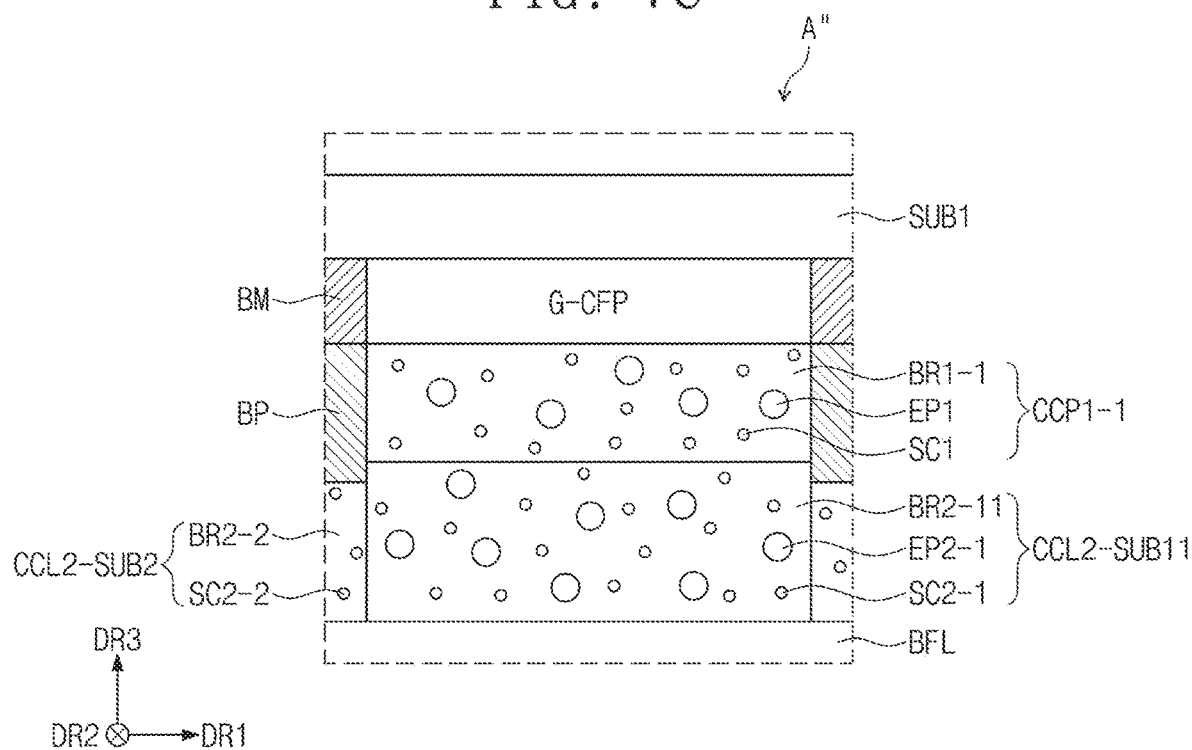

Referring to FIG. 7C, a first light conversion part CCP1-1 may have a smaller thickness than the light blocking pattern BP. On a cross-section (or in a cross-sectional view), the height of the first light conversion part CCP1-1 may be less than or equal to the height of the light blocking pattern BP.

In some exemplary embodiments, a first sub-light conversion part CCL2-SUB11 may be disposed in a step portion that is generated when the thickness of the first light conversion part CCP-1 is smaller than the thickness of the light blocking pattern BP. In FIG. 7C, a second light control layer is illustrated as being patterned so as to include the first sub-light conversion part CCL2-SUB11 and the second sub-light conversion part CCL2-SUB2. However, exemplary embodiments are not limited thereto. The second light control layer may be a single layer integrally formed. On a cross section, the sum of the height of the first light conversion part CCP1-1 and the height of the first sub-light conversion part CCL2-SUB11 may be greater than or equal to the height of the light blocking pattern BP.

Figure 7D:
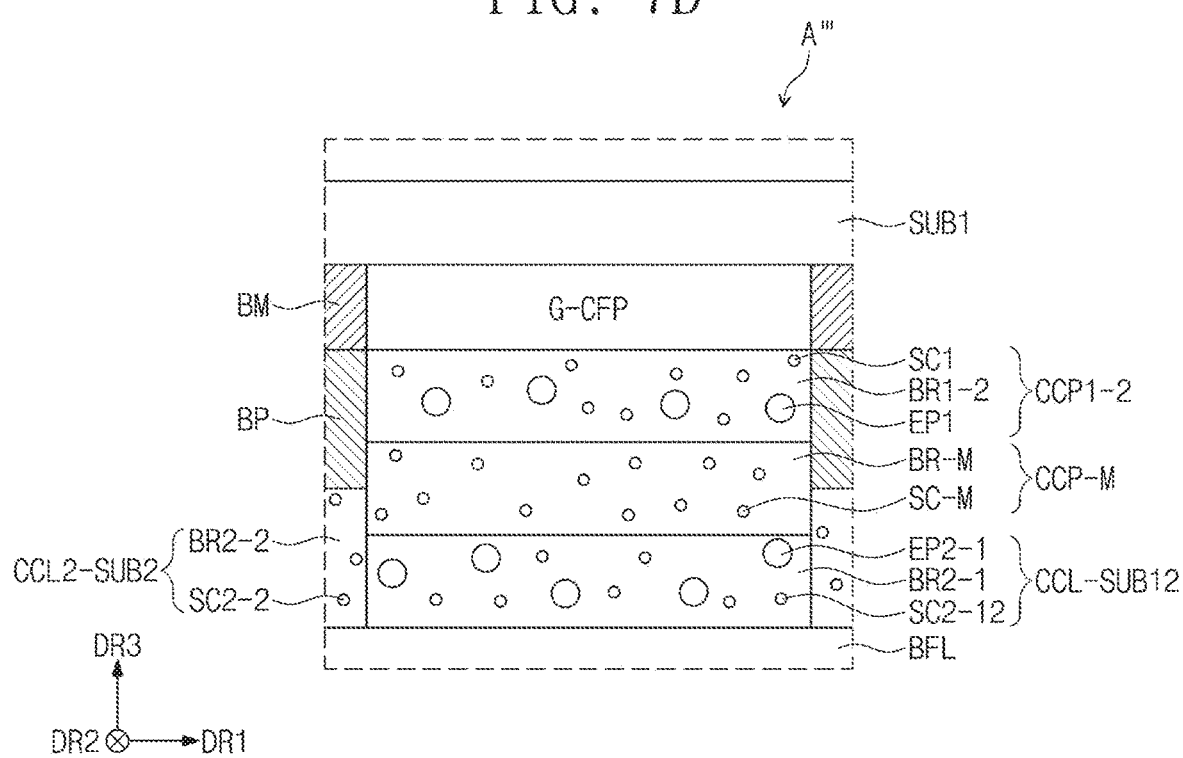

Referring to FIG. 7D, an intermediate portion CCP-M may be included between a first light conversion part CCP1-2 and a first sub-light conversion part CCL2-SUB12.

The intermediate portion CCP-M may include a base resin BR-M and a scattering particle SC-M. The base resin BR-M included in the intermediate portion CCP-M may have the same refractive index as the first and second base resins BR1-2 and BR2-1 included in the first light conversion part CCP1-2 and the first sub-light conversion part CCL2-SUB12. The base resin BR-M may include the same material as the first and second base resins BR1-2 and BR2-1 included in the first light conversion part CCP1-2 and the first sub-light conversion part CCL2-SUB12. The intermediate portion CCP-M may not include a light emitting body.

Figure 8:
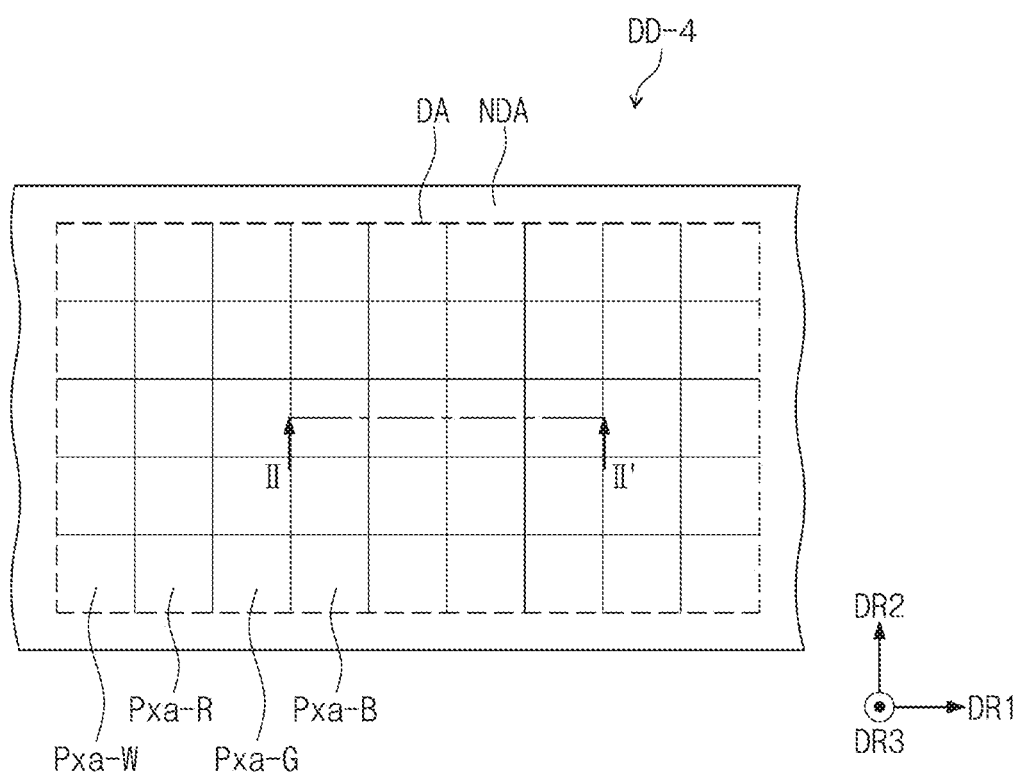
FIG. 8 is a plan view of a display device according to some exemplary embodiments.
Figure 9:
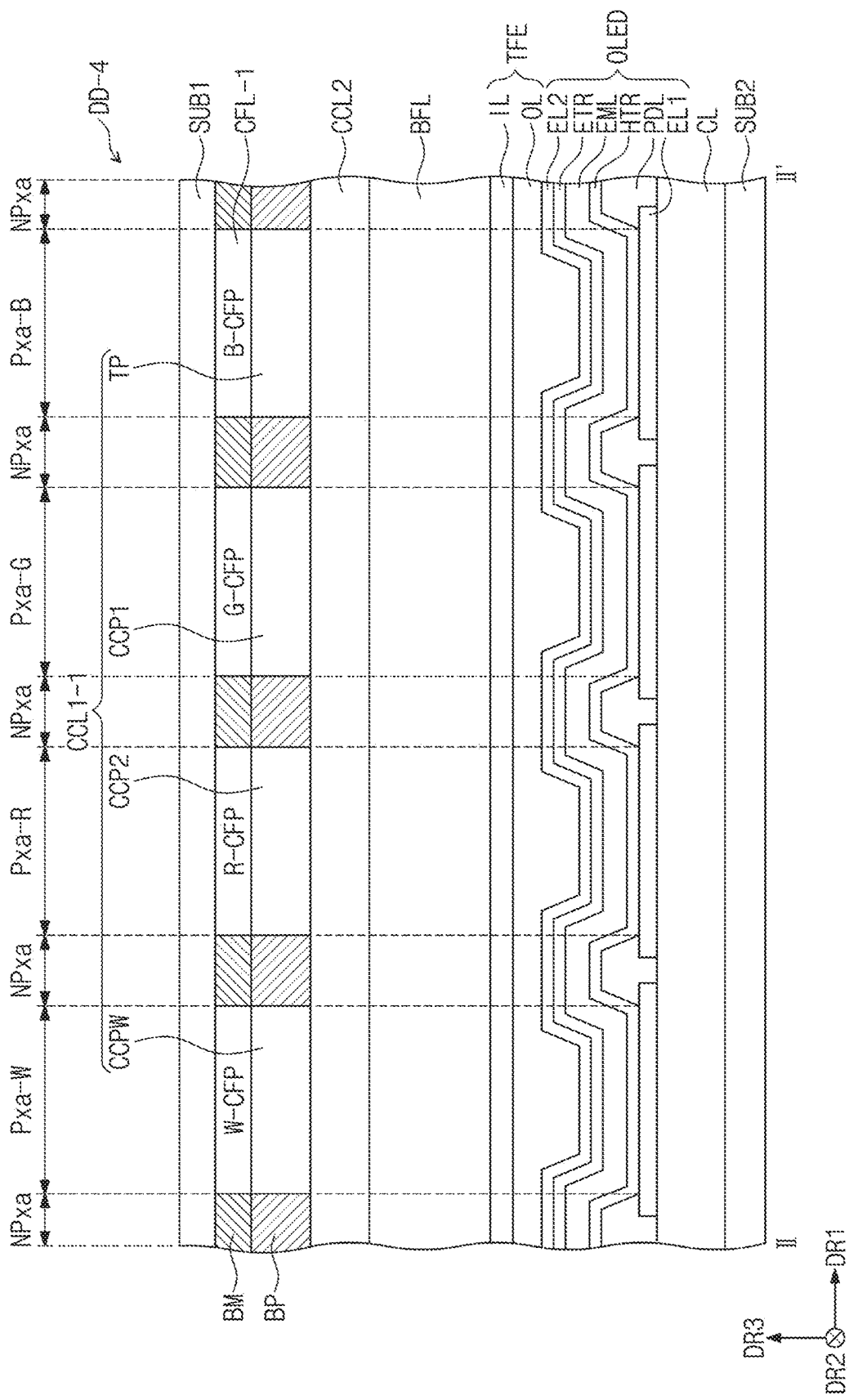
FIG. 9 is a cross-sectional view taken along sectional line II-II' of FIG. 8 according to some exemplary embodiments.

FIG. 8 is a plan view of a display device according to some exemplary embodiments. FIG. 9 is a cross-sectional view taken along sectional line II-II' of FIG. 8 according to some exemplary embodiments. Hereinafter, in the description of FIGS. 8 and 9, the same reference numerals are given to the elements described above and duplicative descriptions are primarily omitted.

Referring to FIGS. 8 and 9, in a display device DD-4 according to some exemplary embodiments, a display region DA may include a plurality of pixel regions Pxa-B, Pxa-G, Pxa-R, and Pxa-W.

The display device DD-4 may include a fourth pixel region in addition to a first pixel region, a second pixel region, and a third pixel region. In some exemplary embodiments, the first pixel region may be a blue pixel region Pxa-B, the second pixel region may be a green pixel region Pxa-G, the third pixel region may be a red pixel region Pxa-R, and the fourth pixel region may be a white pixel region Pxa-W. For instance, in some exemplary embodiments, a display device DD-4 may include the blue pixel region Pxa-B, the green pixel region Pxa-G, the red pixel region Pxa-R, and the white pixel region Pxa-W. The blue pixel region Pxa-B may be a blue light emitting region for emitting blue light, and the green pixel region Pxa-G and the red pixel region Pxa-R may respectively represent a green light emitting region for emitting green light and a red light emitting region for emitting red light. The white pixel region Pxa-W may represent a region for emitting white light.

A first light control layer CCL1-1 may include a transmission part TP that transmits a first light, a first light conversion part CCP1 that converts the first light into a second light, a second light conversion part CCP2 that converts the first light into a third light, and a third light conversion part CCPW that converts the first light into a fourth light. The fourth light may be white light.

The third light conversion part CCPW may include a light emitting body. The light emitting body included in the third light conversion part CCPW may be a quantum dot. In some exemplary embodiments, a light emitting body included in the third light conversion part CCPW may convert the first light into the second light, and the light emitting body included in the third light conversion part CCPW may convert the first light into the third light. The light emitting body included in the third light conversion part CCPW may convert blue light into red light or green light. Alternatively, the third light conversion part CCPW may include both a light emitting body converting blue light into red light and a light emitting body converting blue light into green light. In some exemplary embodiments, the third light conversion part CCPW may be omitted.

In some exemplary embodiments, the display device DD-4 may further include a color filter layer CFL-1 disposed on the first light control layer CCL1-1, and the color filter layer CFL-1 may include first to fourth color filter parts B-CFP, G-CFP, R-CFP and W-CFP, and a light blocking member BM.

The fourth color filter part W-CFP is disposed corresponding to the third light conversion part CCPW, and may transmit light corresponding to the visible light region. The fourth color filter part W-CFP may have a different transmittance according to the wavelength of light. In some exemplary embodiments, the fourth color filter part W-CFP may be omitted.

Figure 10:
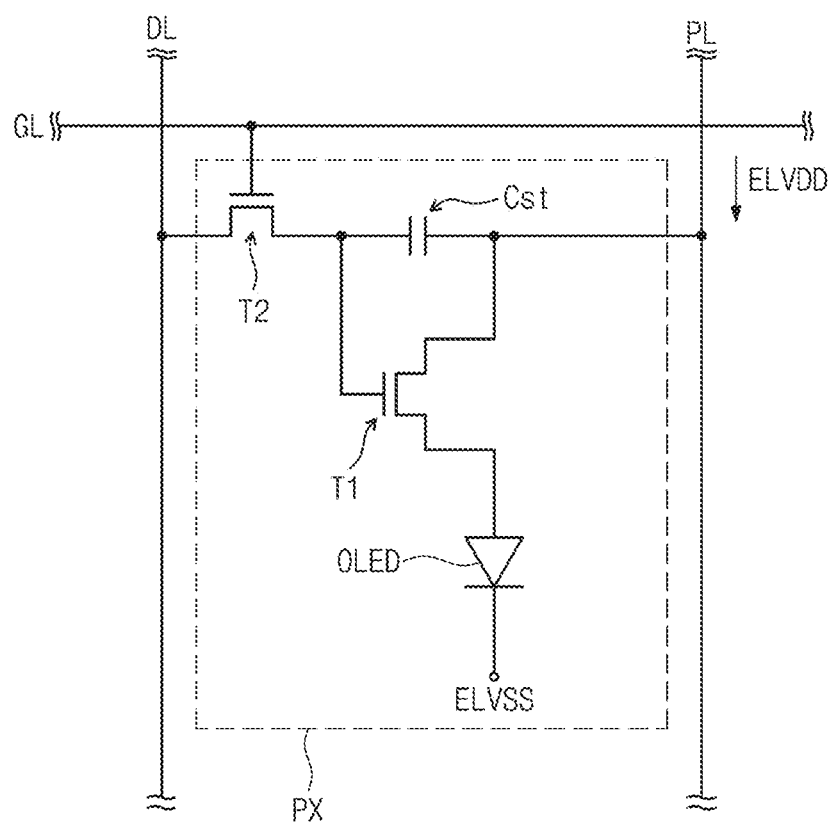
FIG. 10 is an equivalent circuit diagram of a pixel according to some exemplary embodiments.
Figure 11:
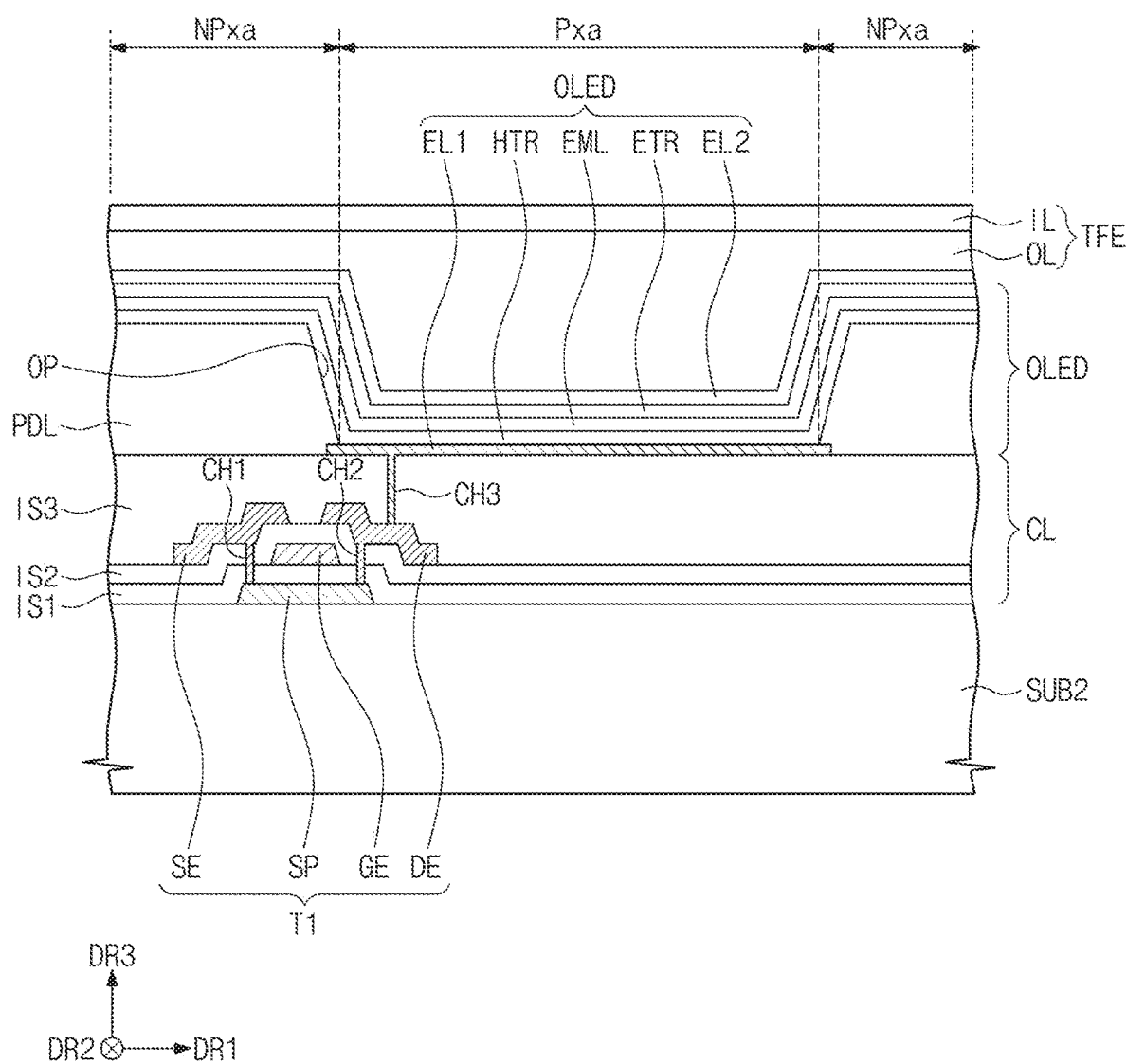
FIG. 11 is a cross-sectional view showing a portion of a display panel according to some exemplary embodiments.

FIG. 10 is an equivalent circuit diagram of a pixel according to some exemplary embodiments. FIG. 11 is a cross-sectional view showing a portion of a display panel according to some exemplary embodiments.

For instance, FIG. 10 shows a scan line GL, a data line DL, a power line PL, and a pixel PX connected thereto. The configuration of the pixel PX is not limited to what is shown in FIG. 10, and may be modified and executed.

The organic light emitting diode OLED may be a front emission type light emitting diode, a bottom emission type light emitting diode, or a dual emission type light emitting diode. The pixel PX includes a first transistor T1 (e.g., a driving transistor), a second transistor T2 (e.g., a switching transistor), and a capacitor Cst as a pixel driving circuit for driving the organic light emitting diode OLED. A first power voltage ELVDD is provided to the first transistor T1, and a second power voltage ELVSS is provided to the organic light emitting diode OLED. The second power voltage ELVSS may be a voltage lower than the first power voltage ELVDD.

The second transistor T2 outputs a data signal applied to the data line DL in response to a scan signal applied to the scan line GL. The capacitor Cst charges a voltage corresponding to the data signal received from the second transistor T2. The first transistor T1 is connected to the organic light emitting diode OLED. The first transistor T1 controls a driving current flowing in the organic light emitting organic diode OLED corresponding to the amount of charge stored in the capacitor Cst.

The equivalent circuit shows only one exemplary embodiment, but exemplary embodiments are not limited thereto. The pixel PX may further include a plurality of transistors and may include a larger number of capacitors. The organic light emitting diode OLED may be connected between the power line PL and the first transistor T1.

FIG. 11 shows a cross-section corresponding to one pixel. In a display device according to some exemplary embodiments, a circuit layer CL, an organic light emitting diode OLED, and an encapsulation member TFE are sequentially disposed on a second substrate SUB2.

In some exemplary embodiments, the circuit layer CL may include a first insulation layer IS1, a second insulation layer IS2, and a third insulation layer IS3. The first insulation layer IS1 and the second insulation layer IS2 may each include an inorganic material, and the kind of the inorganic material is not particularly limited. The third insulation layer IS3 may include an organic material, and the kind of the organic material is not particularly limited. Although not illustrated, on the second substrate SUB2, a barrier layer, which may be an inorganic layer, may be further disposed. The first insulation layer IS1, the second insulation layer IS2, and the third insulation layer IS3 may each have a single-layered structure or a multi-layered structure.

The first transistor T1 includes a semiconductor pattern SP, a control electrode GE, an input electrode SE, and an output electrode DE. On the second substrate SUB2, the semiconductor pattern SP is disposed. The semiconductor pattern SP may include a crystalline semiconductor material or amorphous silicon, but exemplary embodiments are not limited thereto.

On the second substrate SUB2, the first insulation layer IS1 is disposed. The first insulation layer IS1 overlaps both a display region DA and a non-display region NDA, and covers the semiconductor pattern SP.

On the first insulation layer IS1, the control electrode GE is disposed. The control electrode GE overlaps the semiconductor pattern SP. The control electrode GE may be manufactured by the same photolithography process as a photolithography process by which the scan line GL (see FIG. 10) is manufactured.

On the first insulation layer IS1, the second insulation layer IS2 is disposed. The second insulation layer IS2 overs the first insulation layer IS1 and the control electrode GE. On the second insulation layer IS2, the input electrode SE and the output electrode DE are disposed. Each of the input electrode SE and the output electrode DE is connected to the semiconductor pattern SP through a plurality of contact holes (e.g., first and second contact holes CH1 and CH2) defined on (or in) the first and second insulation layers IS1 and IS2. The first transistor T1 may be transformed to have a bottom gate structure or a dual gate structure.

On the second insulation layer IS2, the third insulation layer IS3 covering the first transistor T1 is disposed. The third insulation layer IS3 may provide a flat surface.

On the third insulation layer IS3, the organic light emitting diode OLED and a pixel definition film PDL are disposed. The pixel definition film PDL may include an organic material. An opening OP of (or in) the pixel definition film PDL exposes at least a portion of the first electrode EL1. The opening OP of the pixel definition film PDL may define a light emitting region Pxa of a pixel. In some exemplary embodiments, the pixel definition film PDL may be omitted.

In some exemplary embodiments, the light emitting region Pxa may overlap at least one of the first and second transistors T1 and T2. In this case, the opening OP may become wider, and the first electrode EL1 may also become wider.

On the third insulation layer IS3, the first electrode EL1 is disposed. The first electrode EL1 may be formed of a metal alloy or a conductive compound. The first electrode EL1 may be an anode. The first electrode EL1 may be a transmissive electrode, a transflective electrode, or a reflective electrode.

A hole transport region HTR is provided on the first electrode EL1. The hole transport region HTR may include at least one of a hole injection layer, a hole transport layer, a hole buffer layer, and an electron blocking layer.

The hole transport region HTR may have a single-layered structure having a single layer formed of a single material, a single-layered structure having a single layer formed of a plurality of different materials, or a multi-layered structure having a plurality of layers formed of a plurality of different materials.

For example, the hole transport region HTR may have a single-layered structure having a single layer of the hole injection layer or the hole transport layer, or a single-layered structure having a single layer formed of a hole injection material and a hole transport material. In some exemplary embodiments, the hole transport region HTR may have a single-layered structure having a single layer formed of a plurality of different materials, or have a structure of a hole injection layer/a hole transport layer, a hole injection layer/a hole transport layer/a hole buffer layer, a hole injection layer/a hole buffer layer, a hole transport layer/a hole buffer layer, or hole injection layer/a hole transport layer/an electron blocking layer, sequentially laminated on the first electrode EL1, but exemplary embodiments are not limited thereto.

As described above, the hole transport region HTR according to some exemplary embodiments may further include at least one of a hole buffer layer and an electron blocking layer in addition to a hole injection layer and a hole transport layer.

A light emitting layer EML is provided on the hole transport region HTR. The thickness of the light emitting layer EML may be, for example, about 100 Å to about 300 Å. The light emitting layer EML may have a single-layered structure having a single layer formed of a single material, a single-layered structure having a single layer formed of a plurality of different materials, or a multi-layered structure having a plurality of layers formed of a plurality of different materials.

The light emitting layer EML may include a fluorescent light emitting material or phosphorescent light emitting material. In some exemplary embodiments, the light emitting layer EML may emit blue light. The light emitting layer may emit light of (or in) a wavelength region of 410 nm to 480 nm.

The electron transport region ETR is provided on the light emitting layer EML. The electron transport region ETR may include at least one of the hole blocking layer, the electron transport layer, and the electron injection layer, but is not limited thereto.

The electron transport region ETR may have a single-layered structure having a single layer formed of a single material, a single-layered structure having a single layer formed of a plurality of different materials, or a multi-layered structure having a plurality of layers formed of a plurality of different materials. For example, the electron transport region ETR may have a single-layered structure having a single layer of the electron injection layer or the electron transport layer, or a single-layered structure having a single layer formed of an electron injection material and an electron transport material. In some exemplary embodiments, the electron transport region ETR may have a single-layered structure having a single layer formed of a plurality of different materials, or have a structure of an electron transport layer/an electron injection layer, or a hole blocking layer/an electron transport layer/an electron injection layer, sequentially laminated from the light emitting layer EML, but exemplary embodiments are not limited thereto.

The second electrode EL2 is provided on the electron transport region ETR. The second electrode EL2 has conductivity. The second electrode EL2 may be formed of a metal alloy or a conductive compound. The second electrode EL2 may be a cathode. The second electrode EL2 may be a transmissive electrode, a transflective electrode, or a reflective electrode.

Although not illustrated, the second electrode EL2 may be connected to an auxiliary electrode. When the second electrode EL2 is connected to the auxiliary electrode, the resistance of the second electrode EL2 may be reduced.

On the second electrode EL2, an encapsulation member TFE may be disposed. The encapsulation member TFE is commonly disposed in the pixel regions Pxa-B, Pxa-G, and Pxa-R, and the peripheral region NPxa. The encapsulation member TFE may directly cover the second electrode EL2. The encapsulation member TFE may include at least one inorganic film and may further include an organic film, or may have a structure in which the inorganic film and the organic film are alternately repeated. In some exemplary embodiments, the encapsulation member TFE may include an inorganic film IL at an outermost periphery.

Hereinafter, a method of manufacturing a display device according to some exemplary embodiments will be described with reference to the accompanying drawings.

FIGS. 12A to 12D are cross-sectional views of a display device at various stages of manufacture according to some exemplary embodiments. FIG. 13 is a cross-sectional view of a display device at a stage of manufacture according to some exemplary embodiments. In FIGS. 12A to 12D, steps of preparing an upper display substrate in the method of manufacturing a display device according to some exemplary embodiments are sequentially illustrated. In FIG. 13, a step of coupling the upper display substrate and a lower display substrate in the method of manufacturing a display device according to some exemplary embodiments is illustrated.

The method of manufacturing a display device according to some exemplary embodiments includes preparing an upper display substrate, preparing a lower display substrate, and coupling the upper display substrate and the lower display substrate together.

Figure 12A:
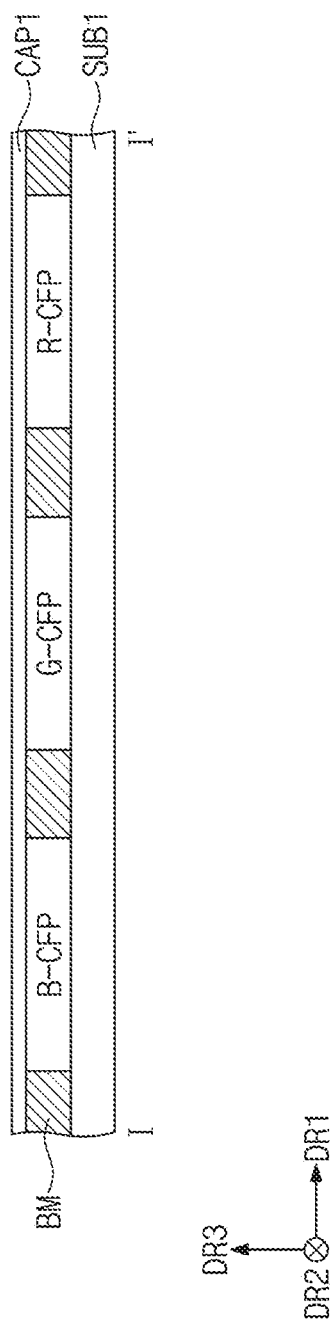
Figure 13:
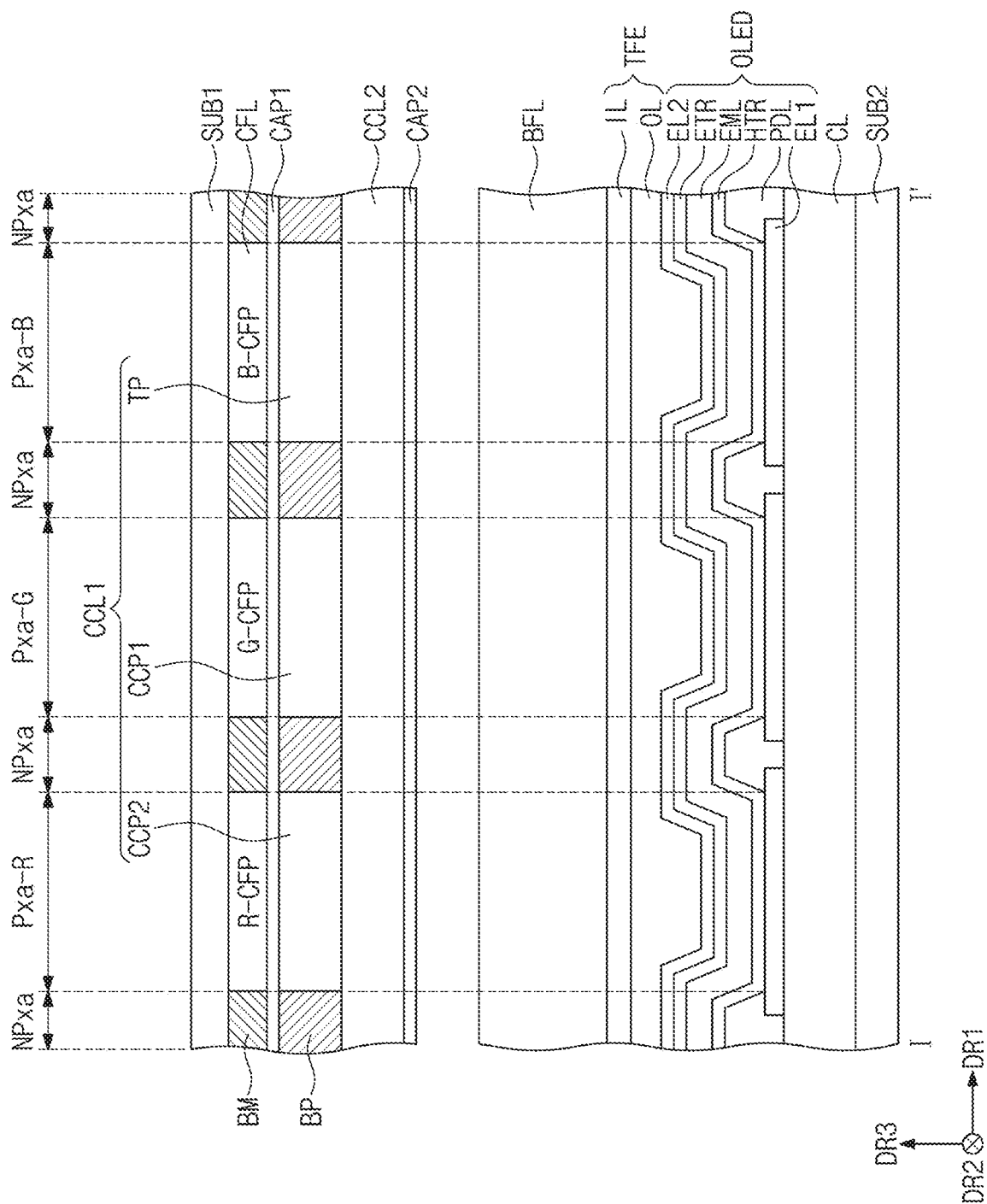
FIG. 13 is a cross-sectional view of a display device at a stage of manufacture according to some exemplary embodiments.

Referring to FIG. 12A, preparing the upper display substrate includes preparing a base substrate SUB1 (also referred to as the first substrate SUB1). The method may further include forming a color filter layer on the base substrate SUB1. The color filter layer may include first to third color filter parts B-CFP, G-CFP, and R-CFP, and a light blocking member BM. Each of the first to third color filter parts B-CFP, G-CFP, and R-CFP may be formed to overlap first to third pixel regions Pxa-B, Pxa-G, and Pxa-R (see FIG. 3). Each of the first to third color filter parts B-CFP, G-CFP, and R-CFP of the color filter layer may be formed through a solution process, such as at least one of a spin coating process, a slit coating process, an ink jet process, and a photoresist process.

Figure 12B:
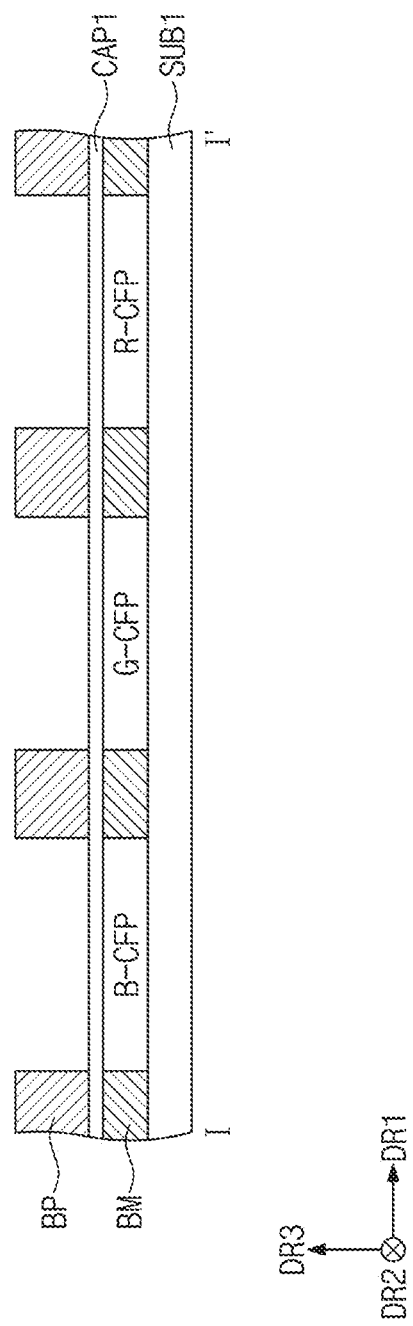

Referring to FIGS. 12A to 12C, on the color filter layer, a light blocking pattern BP may be formed. Between the light blocking pattern BP and the color filter layer, a first capping layer CAP1 may be formed. The light blocking pattern BP is formed in the peripheral region NPXa (see FIG. 3), and may define a region on which a transmission part TP, a first light conversion part CCP1, and a second light conversion part CCP2 are to be formed.

In the region defined by the light blocking pattern BP, the transmission part TP, the first light conversion part CCP1, and the second light conversion part CCP2 may be formed. Each of the transmission part TP, the first light conversion part CCP1, and the second light conversion part CCP2 may be formed through a photoresist process. The transmission part TP may be formed to correspond to a first pixel region Pxa-B (see FIG. 3), the first light conversion part CCP1 may be formed to correspond to a second pixel region Pxa-G (see FIG. 3), and the second light conversion part CCP2 may be formed to correspond to a third pixel region Pxa-R (see FIG. 3).

Figure 12D:
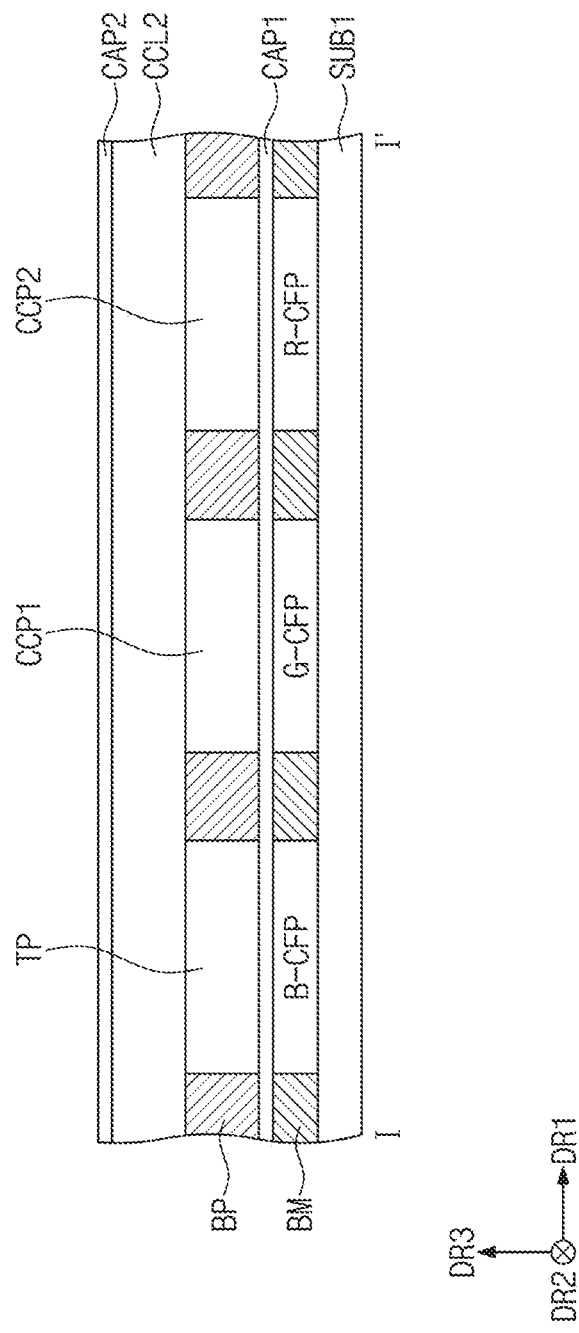

Referring to FIG. 12D, on the transmission part TP, the first light conversion part CCP1, and the second light conversion part CCP2, a second light control layer CCL2 may be formed. The second light control layer CCL2 may be formed through overall coating to entirely overlap the transmission part TP, the first light conversion part CCP1, and the second light conversion part CCP2 in a plan view. The second light control layer CCL2 may be formed through at least one of a photoresist process and a slit coating process. Since the second light control layer CCL2 is formed through overall coating, a process step is skipped allowing the process to be simplified and costs may be reduced.

In FIG. 12D, the second light control layer CCL2 is illustrated as being formed entirely on the transmission part TP, the first light conversion part CCP1, and the second light conversion part CCP2 in a plan view, but exemplary embodiments are not limited thereto. The second light control layer CCL2 may be formed by being patterned. For instance, the second light control layer CCL2 entirely overlaps the first light conversion part CCP1 in a plan view, and may be patterned so as not to overlap the transmission part TP and the second light conversion part CCP2.

On the second light control layer CCL2, a second capping layer CAP2 may be formed. The first capping layer CAP1 and the second capping layer CAP2 may be disposed on upper surfaces and lower surfaces of the first light control layer CCL1 and the second light control layer CCL2, and protect the first light control layer CCL1 and the second light control layer CCL2. The first capping layer CAP1 and the second capping layer CAP2 may be omitted.

Referring to FIG. 13, the method of manufacturing a display device according to some exemplary embodiments includes coupling the upper display substrate and the lower display substrate. The coupling of the upper display substrate and the lower display substrate may be performed such that a light emitting region of a pixel defined by an opening of a pixel definition film PDL corresponds to the first to third pixel regions Pxa-R, Pxa-G, and Pxa-B.

According to various exemplary embodiments, a display device may include a second light control layer at least a portion of which overlaps a first light conversion part of a first light control layer, thereby enabling an increase in the efficiency of converting a first light into a second light. Accordingly, overall light efficiency of a display device may be increased.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a base substrate comprising a pixel region and a peripheral region adjacent to the pixel region;
   a plurality of display elements disposed on the base substrate and overlapping the pixel region in a plan view, the plurality of display elements being configured to generate a first light;
   a first light control layer disposed on the plurality of display elements, the first light control layer comprising:
      a transmission part configured to transmit the first light;
      a first light conversion part configured to convert the first light into a second light; and
      a second light conversion part configured to convert the first light into a third light, the first light has a first wavelength, the second light has a second wavelength different from the first wavelength, and the third light has a third wavelength different from the first wavelength and the second wavelength; and
   a second light control layer overlapping at least a portion of the first light conversion part in the plan view, the second light control layer being configured to convert the first light into the second light.

2. The display device of claim 1, wherein the second light control layer directly contacts at least a portion of the first light control layer.

3. The display device of claim 2, wherein the second light control layer directly contacts the first light conversion part.

4. The display device of claim 2, wherein the second light control layer is disposed between the first light control layer and the plurality of display elements.

5. The display device of claim 2, further comprising:
   a color filter layer disposed on the first light control layer.

6. The display device of claim 5, wherein the color filter layer comprises:
   a first color filter part overlapping the transmission part in the plan view, the first color filter part being configured to transmit the first light;
   a second color filter part overlapping the first light conversion part in the plan view, the second color filter part being configured to transmit the second light; and
   a third color filter part overlapping the second light conversion part in the plan view, the third color filter part being configured to transmit the third light.

7. The display device of claim 5, wherein the second light control layer is disposed between the color filter layer and the first light control layer.

8. The display device of claim 1, wherein the second light control layer is disposed on the first light control layer.

9. The display device of claim 1, wherein:
   the first light conversion part comprises a first plurality of quantum dots; and
   the second light control layer comprises a second plurality of quantum dots.

10. The display device of claim 1, wherein the second light control layer comprises:
    a first sub-light conversion part configured to convert the first light into the second light, the first light conversion part overlapping the first sub-light conversion part in the plan view; and
    a second sub-light conversion part configured to transmit the first light, each of the transmission part and the second light conversion part overlapping the second sub-light conversion part in the plan view.

11. The display device of claim 1, wherein the second light control layer entirely overlaps with the first light control layer in the plan view.

12. The display device of claim 1, wherein:
    the first light is light in a wavelength region of 410 nm to 480 nm;
    the second color is light in a wavelength region of 500 nm to 570 nm; and
    the third light is light in a wavelength region of 625 nm to 675 nm.

13. The display device of claim 1, further comprising:
    an encapsulation member disposed on the plurality of display elements and comprising an inorganic film at its outermost periphery; and
    a filling layer disposed between the first light control layer and the encapsulation member.

14. The display device of claim 1, wherein:
    the first light control layer is disposed between the transmission part, the first light conversion part, and the second light conversion part; and
    the first light control layer further comprises a light blocking pattern overlapping the peripheral region in the plan view.

15. The display device of claim 14, wherein:
    in a cross-sectional view, a height of the first light conversion part is less than or equal to a height of the light blocking pattern; and
    in the cross-sectional view, a sum of the height of the first light conversion part and a height of the second light control layer is greater than or equal to the height of the light blocking pattern.

16. The display device of claim 1, wherein a refractive index of the second light control layer is substantially equivalent to a refractive index of the first light control layer.

17. A display device comprising:
- a base substrate comprising a pixel region and a peripheral region adjacent to the pixel region;
- a display element disposed on the base substrate and overlapping the pixel region in a plan view, the display element being configured to generate a first light having a first wavelength;
- a first light control layer disposed on the display element and overlapping the pixel region in the plan view, the first light control layer being configured to convert the first light into a second light having a second wavelength different from the first wavelength; and
- a second light control layer comprising a portion overlapping the first light control layer in the plan view, the second light control layer being configured to convert the first light into the second light.

18. The display device of claim 17, wherein:
- the first light control layer comprises a first plurality of quantum dots; and
- the second light control layer comprises a second plurality of quantum dots.

\* \* \* \* \*